United States Patent [19]
Cooper

[11] Patent Number: 6,137,428
[45] Date of Patent: Oct. 24, 2000

[54] DATA COMPRESSION METHOD AND APPARATUS WITH EMBEDDED RUN-LENGTH ENCODING USING MATHEMATICAL RUN PROCESSING

[75] Inventor: Albert B. Cooper, New York, N.Y.

[73] Assignee: Unisys Corporation, Blue Bell, Pa.

[21] Appl. No.: 09/300,810

[22] Filed: Apr. 27, 1999

[51] Int. Cl.[7] .................................................. H03M 7/46
[52] U.S. Cl. ................................................. 341/63; 341/50
[58] Field of Search ................................. 341/50, 51, 63, 341/65, 67

[56] References Cited

U.S. PATENT DOCUMENTS

| | | | |
|---|---|---|---|
| 4,929,946 | 5/1990 | O'Brien et al. | 341/87 |
| 4,971,407 | 11/1990 | Hoffman | 341/87 |
| 4,988,998 | 1/1991 | O'Brien | 341/55 |
| 5,247,638 | 9/1993 | O'Brien et al. | 395/425 |
| 5,389,922 | 2/1995 | Seroussi et al. | 341/51 |
| 5,764,167 | 6/1998 | Adams et al. | 341/63 |
| 5,861,827 | 1/1999 | Welch et al. | 341/51 |

OTHER PUBLICATIONS

Internet site: http://www.boutell.com/gd. pp. 1–2.

*Primary Examiner*—Peguy JeanPierre
*Attorney, Agent, or Firm*—Albert B. Cooper; Mark T. Starr; Rocco L. Adornato

[57] ABSTRACT

The disclosed data compressor receives an input stream of data characters and provides a corresponding stream of output codes. The compressor provides a sequence of numerically increasing output codes corresponding to numerically increasing contiguous segments of a detected run of the same character. The number of characters in the detected run is determined and a mathematical algorithm, using the number of characters in the run, mathematically generates the appropriate sequence of codes. One disclosed embodiment utilizes a mathematical algorithm that iteratively diminishes the number of run characters by an iteratively increasing segment index. Another embodiment utilizes a quadratic equation algorithm that computes the codes from the number of characters in the run utilizing equations derived from the expression for the sum of the first n numbers. In a further embodiment, the number of characters in the run segments are stored together with the respective codes representing the segments. In later encounters of a previously processed run, the stored data is accessed and the stored codes corresponding to the run segments are output as appropriate. Non-run characters of the input stream are transmitted directly in synchronism with incrementing the codes of the code sequence.

48 Claims, 11 Drawing Sheets

INPUT DATA CHARACTER STREAM $a_1\ a_2\ a_3\ a_4\ a_5\ a_6\ a_7\ a_8\ a_9\ a_{10}\ a_{11}\ a_{12}\ a_{13}\ w\ x\ y\ z\ d\ b_1\ b_2\ b_3\ \ldots b_{90}\ c$

| ACTIONS | CURR CHAR | LOOK-AHEAD CHARS | CODE COUNTER | OUTPUT | R | T | n | DISCARD CHARS | BLOCKS OF FIGS. 2,3,4 |
|---|---|---|---|---|---|---|---|---|---|
| 1 | $a_1$ | $a_2\ a_3$ | 258 | $a_1$ | 13 | 12 | 2 | | 40-44,50,70,71 |
| 2 | | | 259 | 258 | | 10 | 3 | | 72-78 |
| 3 | | | 260 | 259 | | 7 | 4 | | 72-78 |
| 4 | | | 261 | 260 | | 3 | 5 | | 72-78 |
| 5 | | | 262 | $a_1$ | | 2 | 2 | | 80-85,71 |
| 6 | | | 263 | 262 | | 0 | 3 | $a_2$-$a_{13}$ | 72-78,80,90,60 |
| 7 | w | x y | 264 | w | | | | | 61-64,43,44 |
| 8 | x | y z | 265 | x | | | | | 45-48,43,44 |
| 9 | y | z d | 266 | y | | | | | 45-48,43,44 |
| 10 | z | d $b_1$ | 267 | z | | | | | 45-48,43,44 |
| 11 | d | $b_1\ b_2$ | 268 | d | | | | | 45-48,43,44 |
| 12 | b1 | $b_2\ b_3$ | 269 | $b_1$ | 90 | 89 | 2 | | 45-48,43,44, 50,70 71 |
| 13 | | | 270 | 269 | | 87 | 3 | | 72-78 |
| 14 | | | 271 | 270 | | 84 | 4 | | 72-78 |
| 15 | | | 272 | 271 | | 80 | 5 | | 72-78 |
| | | | ... | ... | | .. | . | | 72-78 |
| | | | ... | ... | | .. | . | | |
| | | | ... | ... | | .. | . | | |
| 16 | | | 279 | 278 | | 24 | 12 | | 72-78 |
| 17 | | | 280 | 279 | | 12 | 13 | | 72-78 |
| 18 | | | 281 | $b_1$ | | 11 | 2 | | 80-85,71 |
| 19 | | | 282 | 281 | | 9 | 3 | | 72-78 |
| 20 | | | 283 | 282 | | 6 | 4 | | 72-78 |
| 21 | | | 284 | 283 | | 2 | 5 | | 72-78 |
| 22 | | | 285 | $b_1$ | | 1 | | | 80,90-95 |
| 23 | | | 286 | $b_1$ | | 0 | | $b_2$-$b_{90}$ | 90-95,60 |
| 24 | c | | 287 | c | | | | | 61-64,43 |

*Figure 5*

INPUT DATA CHARACTER STREAM $a_1\ a_2\ a_3\ a_4\ a_5\ a_6\ a_7\ a_8\ a_9\ a_{10}\ a_{11}\ a_{12}\ a_{13}\ w\ x\ y\ z\ d\ b_1\ b_2\ b_3\ \ldots b_{90}\ c$

| ACTIONS | CURR CHAR | LOOK-AHEAD CHARS | CODE CNTR | OUT-PUT | R | T | n | L | D | DISCARD CHARS | BLOCKS FIGS. 2,4,7 |
|---|---|---|---|---|---|---|---|---|---|---|---|
| 1 | $a_1$ | $a_2\ a_3$ | 258 | a1 | 13 | 13 | 4 | 261 | 10 | | 40-44,50,120-123 |
| 2 | | | 259 | 258 | | | | | | | 124-128 |
| 3 | | | 260 | 259 | | | | | | | 124-128 |
| 4 | | | 261 | 260 | | 3 | | | | | 124-128,140 |
| 5 | | | 262 | a1 | | | 2 | 263 | 3 | | 141-145,121-123 |
| 6 | | | 263 | 262 | | 0 | | | | $a_2$-$a_{13}$ | 124-128,140,141, 90,60 |
| 7 | w | x y | 264 | w | | | | | | | 61-64,43,44 |
| 8 | x | y z | 265 | x | | | | | | | 43-48 |
| 9 | y | z d | 266 | y | | | | | | | 43-48 |
| 10 | z | d $b_1$ | 267 | z | | | | | | | 43-48 |
| 11 | d | $b_1\ b_2$ | 268 | d | | | | | | | 43-48 |
| 12 | $b_1$ | $b_2\ b_3$ | 269 | $b_1$ | 90 | 90 | 12 | 280 | 78 | | 48,43,44,50, 120-123 |
| 13 | | | 270 | 269 | | | | | | | 124-128 |
| 14 | | | 271 | 270 | | | | | | | 124-128 |
| 15 | | | 272 | 271 | | | | | | | 124-128 |
| | | | ... | ... | | | | | | | 124-128 |
| 16 | | | 280 | 279 | | 12 | | | | | 124-128,140 |
| 17 | | | 281 | b1 | | | 4 | 284 | 10 | | 141-145,121-123 |
| 18 | | | 282 | 281 | | | | | | | 124-128 |
| 19 | | | 283 | 282 | | | | | | | 124-128 |
| 20 | | | 284 | 283 | | 2 | | | | | 124-128,140,141 |
| 21 | | | 285 | $b_1$ | | 1 | | | | | 90-95 |
| 22 | | | 286 | $b_1$ | | 0 | | | | | 90-95 |
| 23 | c | | 287 | c | | | | | | $b_2$-$b_{90}$ | 60-64,43 |

*Figure 8*

INPUT DATA CHARACTER STREAM $a_1\ a_2\ a_3\ a_4\ a_5\ a_6\ a_7\ a_8\ a_9\ a_{10}\ a_{11}\ a_{12}\ w\ x\ y\ z\ a_{13}\ a_{14}\ a_{15}\ \ldots\ a_{21}$

| ACTIONS | CURR CHAR | LOOK-AHEAD CHARS | FLAG | CODE CNTR | OUT-PUT | R | T | D | n | M | DISCARD CHARS | TABLE CODE | TABLE COUNT | BLOCKS OF FIG. 11 |
|---|---|---|---|---|---|---|---|---|---|---|---|---|---|---|
| 1 | $a_1$ | $a_2\ a_3$ | SET | 258 | | | | | | | | | | 40-44,230,231 |
| 2 | | | RESET | | $a_1$ | | | | | | | | | 234-237,71 |
| 3 | | | | 259 | 258 | | 11 | 0 | 2 | | | 258 | 2 | 72-78,240,241 |
| 4 | | | | 260 | 259 | | 9 | 2 | 3 | | | 259 | 3 | 72-78,240,241 |
| 5 | | | | 261 | 260 | | 6 | 5 | 4 | | | 260 | 4 | 72-78,240,241,245 |
| 6 | $a_{11}$ | $a_{12}$ | | 262 | 258 | 2 | 2 | 9 | 5 | | $a_2$-$a_{10}$ | | | 246-249,231,232,260-264,245 |
| 7 | w | x | | 263 | w | | | | | | $a_{12}$ | | | 246-249,231,233 |
| 8 | x | y | | 264 | x | | | | | | | | | 45-48,231,233 |
| 9 | y | z | | 265 | y | | | | | | | | | 45-48,231,233 |
| 10 | z | $a_{13}$ | | 266 | z | | | | | | | | | 45-48,231,233 |
| 11 | $a_{13}$ | $a_{14}$ | | 267 | 260 | 9 | 5 | 3 | 5 | 4 | | | | 72-78,240,241,245 |
| 12 | | | | 268 | 267 | | 0 | 8 | 6 | 4 | $a_{14}$-$a_{21}$ | 267 | 5 | 45-48,231,232,260-262,265-268 |
| 13 | | | | 269 | | | | | | | | | | 246-248 |

*Figure 12*

DATA COMPRESSION METHOD AND APPARATUS WITH EMBEDDED RUN-LENGTH ENCODING USING MATHEMATICAL RUN PROCESSING

CROSS REFERENCE TO RELATED APPLICATIONS

U.S. patent application Ser. No. 09/264,269 by Cooper, filed Mar. 8, 1999, entitled "Data Compression Method And Apparatus With Embedded Run-Length Encoding" is incorporated herein by reference.

BACKGROUND OF THE INVENTION

1. Field of the Invention

The invention relates to data compression particularly with respect to providing data compression embodiments with embedded run-length encoding that have heretofore not been developed in the prior art.

2. Description of the Prior Art

Professors Abraham Lempel and Jacob Ziv provided the theoretical basis for LZ data compression and decompression systems that are in present day widespread usage. Two of their seminal papers appear in the IEEE Transactions on Information Theory, IT-23-3, May 1977, pp. 337–343 and in the IEEE Transactions on Information Theory, IT-24-5, September 1978, pp. 530–536. A ubiquitously used data compression and decompression system known as LZW, adopted as the standard for V.42 bis modem compression and decompression, is described in U.S. Pat. No. 4,558,302 by Welch, issued Dec. 10, 1985. LZW has been adopted as the compression and decompression standard used in the GIF and TIFF image communication protocols.

Another type of data compression and decompression, denoted as Run-Length Encoding (RLE), compresses a repeating character run by providing a compressed code indicating the character and the length of the run. RLE is thus effective in encoding long strings of the same character. For example, RLE is effective in compressing a long sequence of blanks that may be included at the beginning of a data file. RLE is also effective in image compression where an image contains a long run of consecutive pixels having the same value, such as in the sky portion of a land-sky image.

In the prior art, run-length encoding has been combined with an LZ system by applying the data to a run-length encoder and then applying the run length encoded data to the LZ based system. In such an architecture, a run-length encoder is utilized at the front end of the compressor and a run-length decoder is utilized at the output end of the decompressor. Such a system suffers from the disadvantages of increased equipment, expense, control overhead and processing time.

Run-length encoding has also been included in the LZW based system of U.S. Pat. No. 5,389,922 by Seroussi et al, issued Feb. 14, 1995. In the system of this patent certain output codes from the compressor are suppressed in the presence of a run of repeating input data characters. A special run enhancement engine is utilized at the input to the decompressor to regenerate the missing codes.

Another data compression and decompression system involving the encoding of data character runs is disclosed in U.S. Pat. No. 5,861,827 by Welch et al., issued Jan. 19, 1999. In the compressor of this system, when a partial string W and character C are found, a new string is stored with C as an extension character on the string PW where P was the string conveyed in the last transmitted output compressed code. With this compression algorithm, a run of characters is encoded in two compressed codes regardless of its length. The decompressor of this system uses a special unrecognized code process to maintain synchronism with the compressor.

Another data compression system involving the encoding of data character runs is disclosed in said U.S. patent application Ser. No. 09/264,269. In the compressor of this patent application, runs are processed by successively looking ahead into the input to determine if contiguous numerically increasing segments exist in the run.

It is an object of the present invention to provide further data compression embodiments that utilize run-length encoding. It is particularly desirable to provide embodiments that merely count the number of characters in a run and provide the appropriate output codes therefor.

SUMMARY OF THE INVENTION

The compressor of the present invention determines the number of characters in a run of input data characters and mathematically generates a sequence of numerically increasing output codes corresponding, respectively, to numerically increasing contiguous segments of the run. Embodiments are disclosed that utilize an iterative mathematical algorithm and a quadratic equation algorithm, respectively, to process the run. Consecutive characters that differ with respect to each other are transmitted directly and in synchronism with incrementing the compressor code counter.

BRIEF DESCRIPTION OF THE DRAWINGS

FIG. 5 is a chart exemplifying the operations of the compressor of FIG. 1 in accordance with the control flow charts of FIGS. 2, 3 and 4.

FIG. 2 also illustrates the operations executed by the compressor of FIG. 6, except that the run processing logic portion of FIG. 2 utilizes the logic detailed in FIG. 7.

FIG. 8 is a chart exemplifying the operations of the compressor of FIG. 6 in accordance with the control flow charts of FIGS. 2, 4 and 7.

FIG. 12 is a chart exemplifying the operations of the compressor of FIGS. 9 and 10 in accordance with the control flow chart of FIG. 11.

DESCRIPTION OF THE PREFERRED EMBODIMENTS

Figure 1:
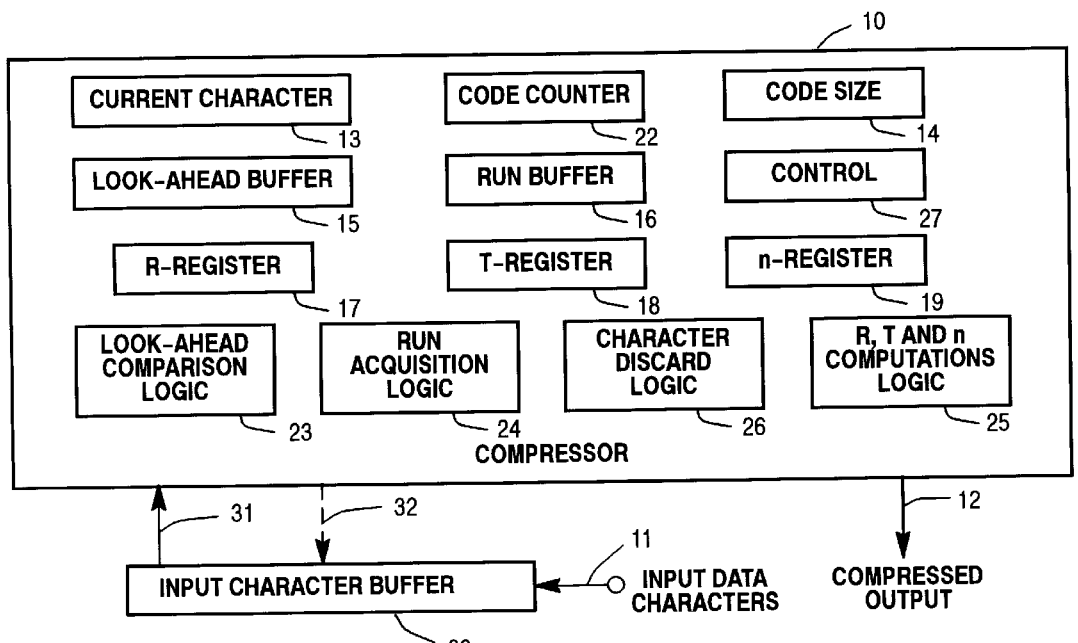
FIG. 1 is a schematic block diagram of a data compressor providing a preferred embodiment of the present invention. The embodiment of FIG. 1 is a non-storage configuration where character runs are newly processed each time they are encountered utilizing an iterative mathematical algorithm.
Figure 6:
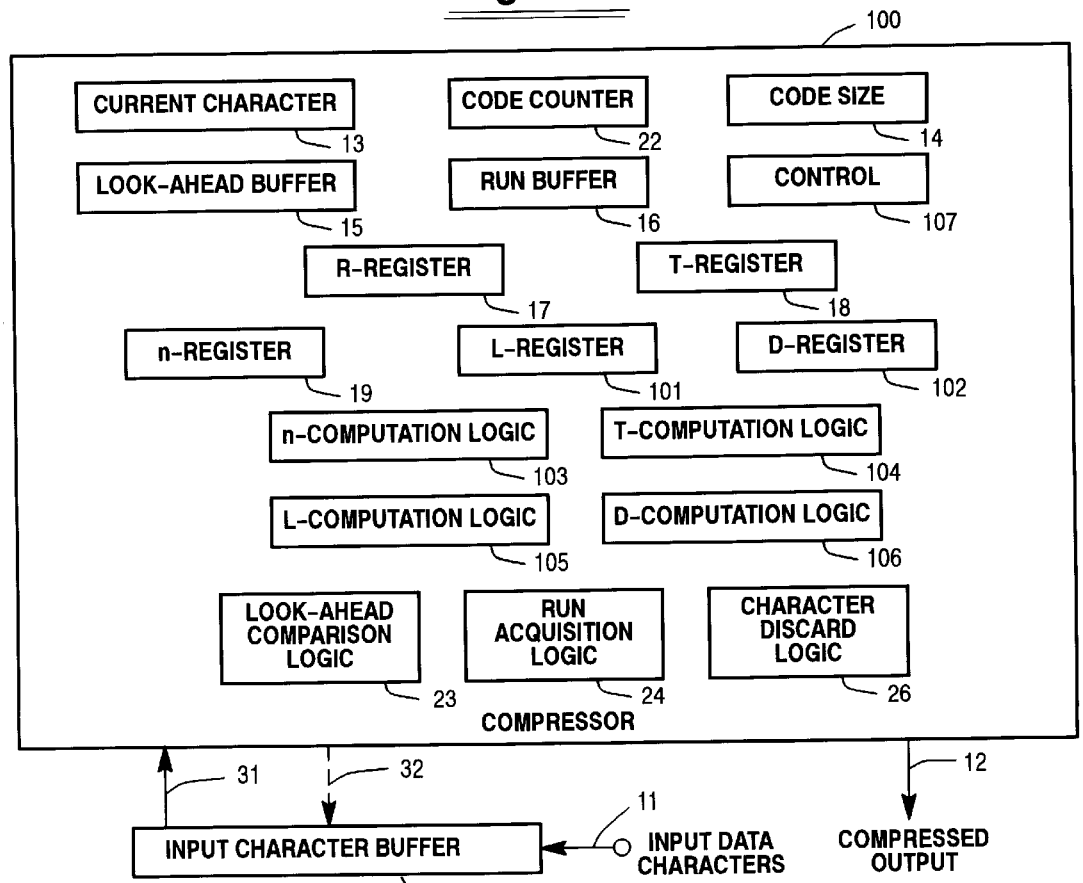
FIG. 6 is a schematic block diagram of a data compressor providing a further preferred embodiment of the present invention. The embodiment of FIG. 6 is a non-storage configuration where character runs are newly processed each time they are encountered utilizing a quadratic equation mathematical algorithm.
Figure 2:
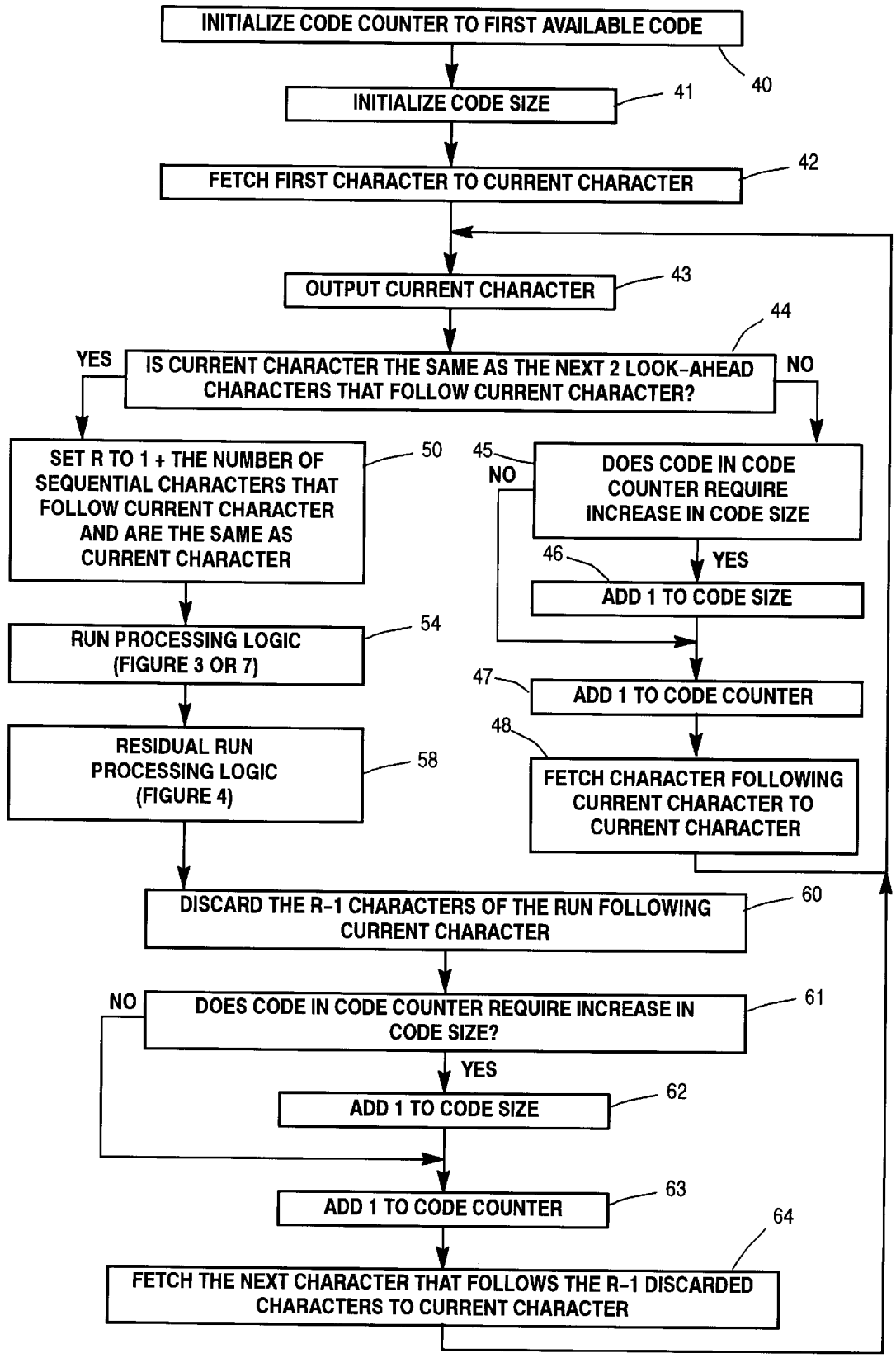
FIG. 2 is a control flow chart illustrating the operations executed by the compressor of FIG. 1 so as to perform data compression in accordance with the present invention.

Before discussing the drawings in detail it is helpful to recall that the flow chart of FIG. 2 is generic to the FIG. 1 and FIG. 6 embodiments. In the FIG. 1 embodiment, the run processing logic of FIG. 2 is implemented by the flow chart of FIG. 3 while in the FIG. 6 embodiment the run processing logic of FIG. 2 is implemented by the flow chart of FIG. 7. In both the FIG. 1 and FIG. 6 embodiments, the residual run processing logic of FIG. 2 is implemented by the flow chart of FIG. 4. The FIG. 1 and FIG. 6 embodiments are non-storage configurations.

Figures 9, 10:
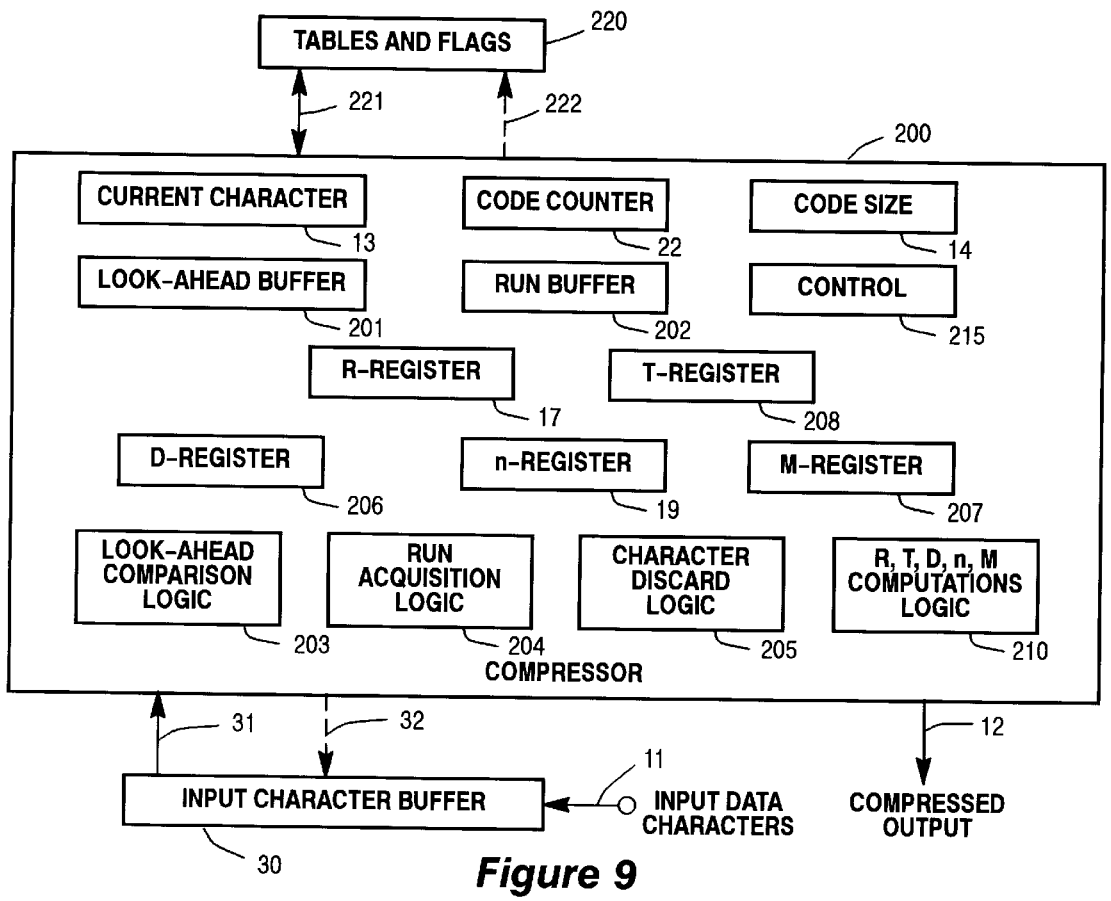
FIG. 9 is a schematic block diagram of a data compressor providing another preferred embodiment of the present invention. The embodiment of FIG. 9 uses storage to save character run data that can be re-used when the character run is again encountered. The FIG. 9 embodiment is based on the iterative mathematical algorithm utilized in the embodiment disclosed by FIGS. 1–4.
FIG. 10 is a data structure diagram illustrating details of the Tables and Flags of FIG. 9.
Figure 11A:
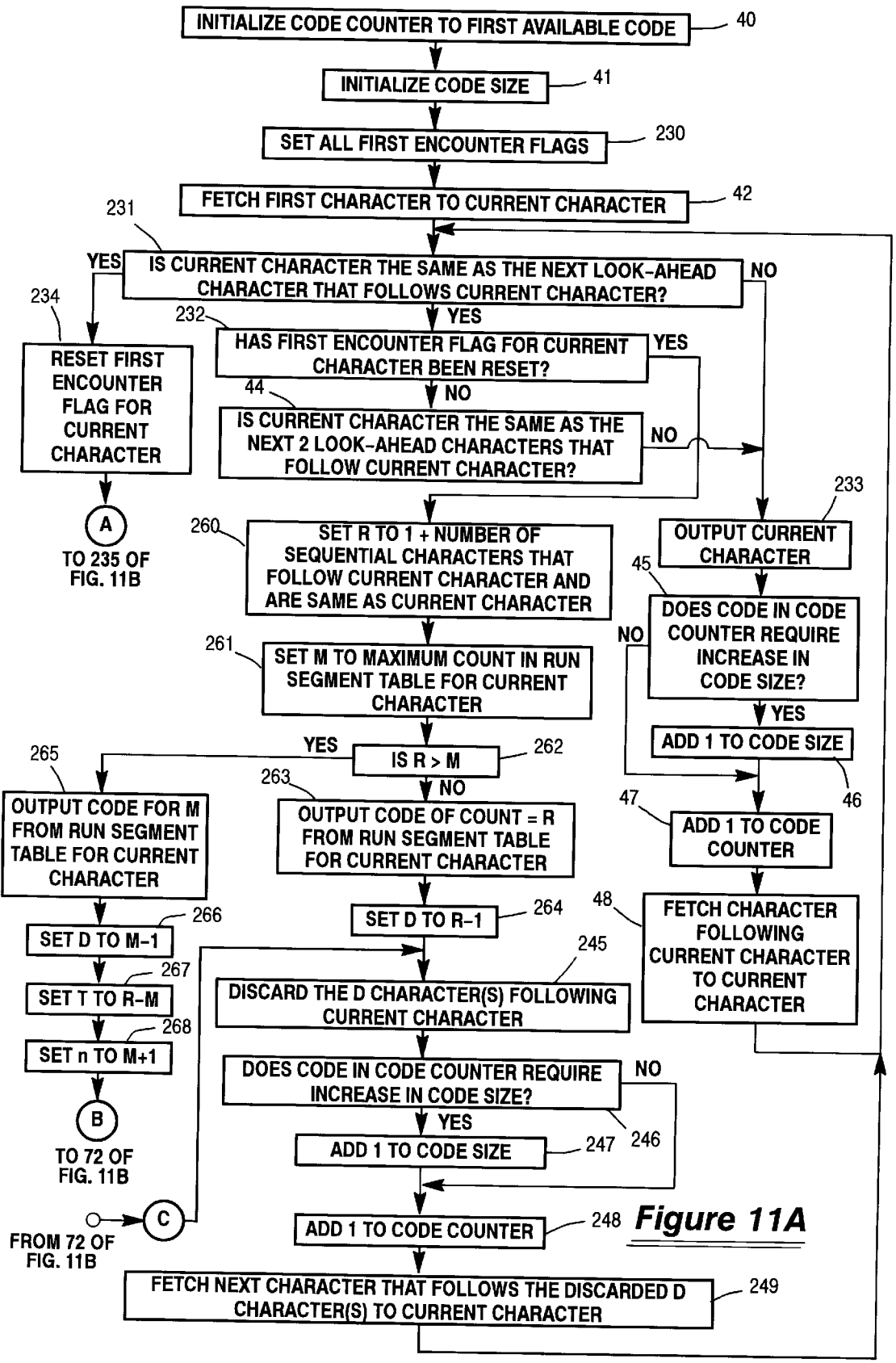
FIG. 11 is a control flow chart illustrating the operations executed by the compressor of FIGS. 9 and 10 so as to perform data compression in accordance with the present invention.
Figure 11B:
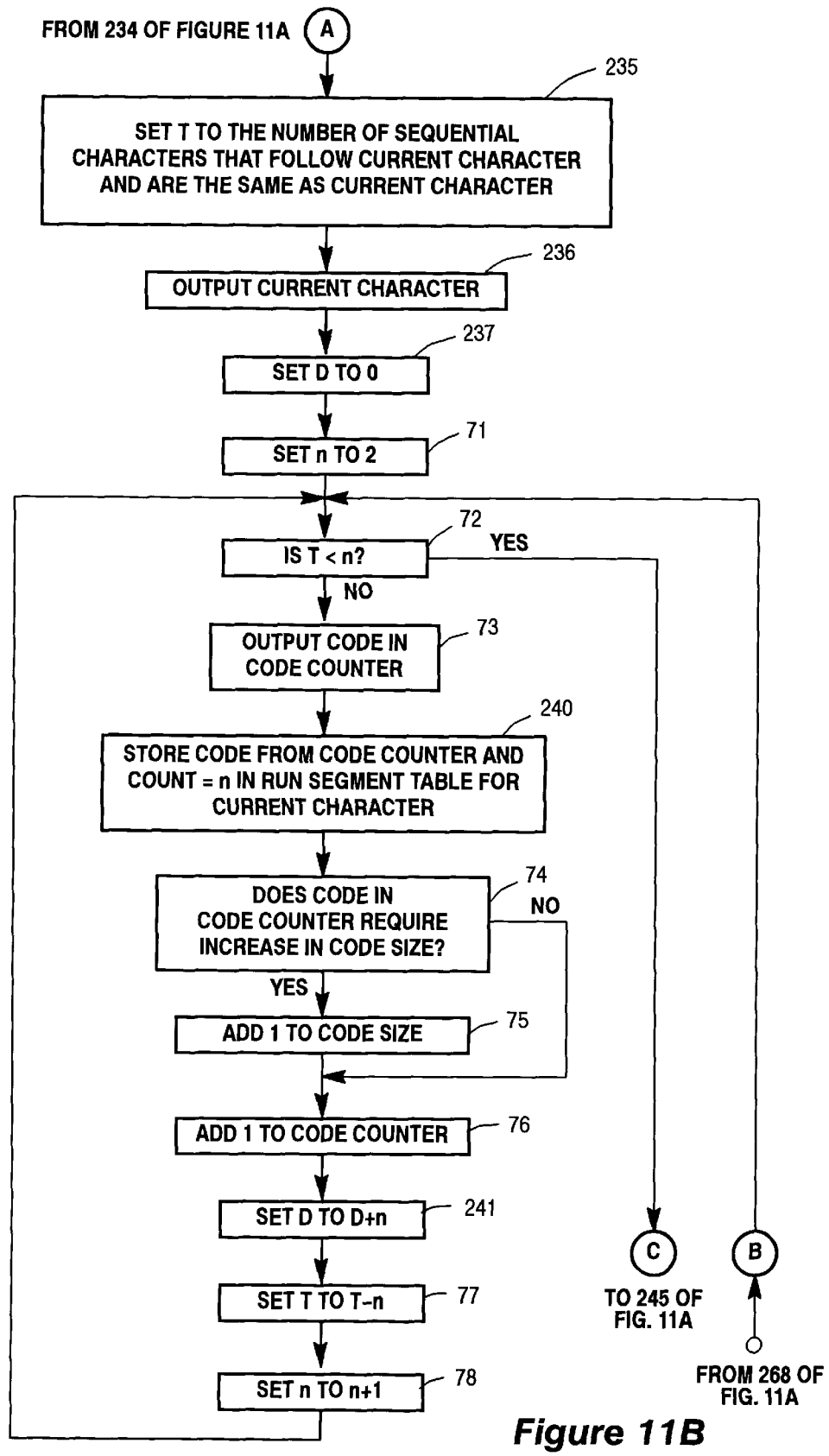

The FIGS. 9 and 10 embodiment utilizes a storage configuration and is controlled in accordance with the flow chart of FIG. 11. This embodiment utilizes the iterative mathematical algorithm of FIG. 3.

It will be appreciated from the ensuing descriptions that in the principle configurations of the FIG. 1 and FIG. 6 embodiments, an entire run is absorbed from the input and appropriate codes corresponding thereto are output without further input fetching once the number of characters in the run have been established. The run is effectively processed "off-line" by the mathematical algorithms detailed in FIGS. 3 and 7.

All of the embodiments described below are predicated on a variable length output and the Code Size register of each embodiment is utilized to this effect. As is well known, for example, in an ASCII implementation having an 8 bit alphabet, the Code Size may begin with 9 bits and sequentially increase to 10, 11, 12, etc., bits at codes 512, 1024, 2048, etc., respectively. It is furthermore appreciated that the embodiments could also be predicated on a fixed length code output of, for example, 12 bits, as is well known.

Referring to FIG. 1, a data compressor 10 is illustrated that compresses a stream of input data characters applied at an input 11 into a stream of corresponding compressed codes at an output 12. The compressor 10 includes working registers denoted as a Current Character register 13, a Code Size register 14, a Look-Ahead Buffer 15, a Run Buffer 16, an R-register 17, a T-register 18 and an n-register 19. The compressor 10 further includes a Code Counter 22 for sequentially generating code values that are used to process run and non-run characters in a manner to be described.

The compressor 10 further includes look-ahead comparison logic 23 that performs comparisons between a character in the Current Character register 13 and characters in the Look-Ahead Buffer 15 to determine if a run is about to commence in a manner to be further described. The compressor 10 further includes run acquisition logic 24 for acquiring and counting the characters of a run pursuant to the run being detected by the logic 23. The number of characters in the run, as counted by the logic 24, is stored in the R-register 17. The Run Buffer 16 provides any buffering required in performing these functions.

The compressor 10 also includes R, T and n computations logic 25 utilized in processing an acquired run in a manner to be explained. The compressor 10 furthermore includes character discard logic 26 for discarding the characters of a processed run. Further included in the compressor 10 is control 27 for controlling the operations of the compressor 10 in accordance with the operational flow charts of FIGS. 2–4 in a manner to be described.

Also included is an Input Character Buffer 30 that buffers the input data character stream received at the input 11. The individual input data characters are applied from the Input Character Buffer 30 via a bus 31 to the Current Character register 13, the Look-Ahead Buffer 15 and the run acquisition logic 24 in accordance with operations to be described. The compressor 10 controls acquiring input data characters from the Input Character Buffer 30 via a control bus 32.

Briefly, the operation of the compressor 10 is as follows. Input data characters are fetched from the Input Character Buffer 30 to the Current Character register 13 and to the Look-Ahead Buffer 15 permitting the logic 23 to perform a comparison between Current Character and the next two look-ahead characters. If the three characters are the same, run processing is performed. Otherwise, the character in the Current Character register 13 is output and the next character following Current Character is fetched into the Current Character register 13.

If a character run is detected, the number of characters in the run is determined and the character beginning the run, residing in the Current Character register 13 is output. Run processing logic is then invoked to mathematically determine the numerically increasing run segments that exist in the run. Specifically, it is determined if contiguous run segments of two characters, four characters, five characters, etc., exist in the run following the character in the Current Character register 13. For each such detected run segment, the code in the Code Counter 22 is output and the Code Counter 22 is incremented by 1. This process is implemented by iteratively subtracting the number of characters in each contiguous segment from the number of characters in the run until insufficient characters remain to populate the next run segment in the sequence.

When this occurs and three or more characters remain to be processed, the character residing in the Current Character register 13 is output and the Code Counter 22 is again advanced by 1. The iterative process is reset to a run segment of two characters and the process continued until less than three run characters remain. When this occurs residual run processing logic is invoked.

In residual run processing, the residual run characters are treated as non-run characters until all of the detected run characters have been processed.

Figure 3:
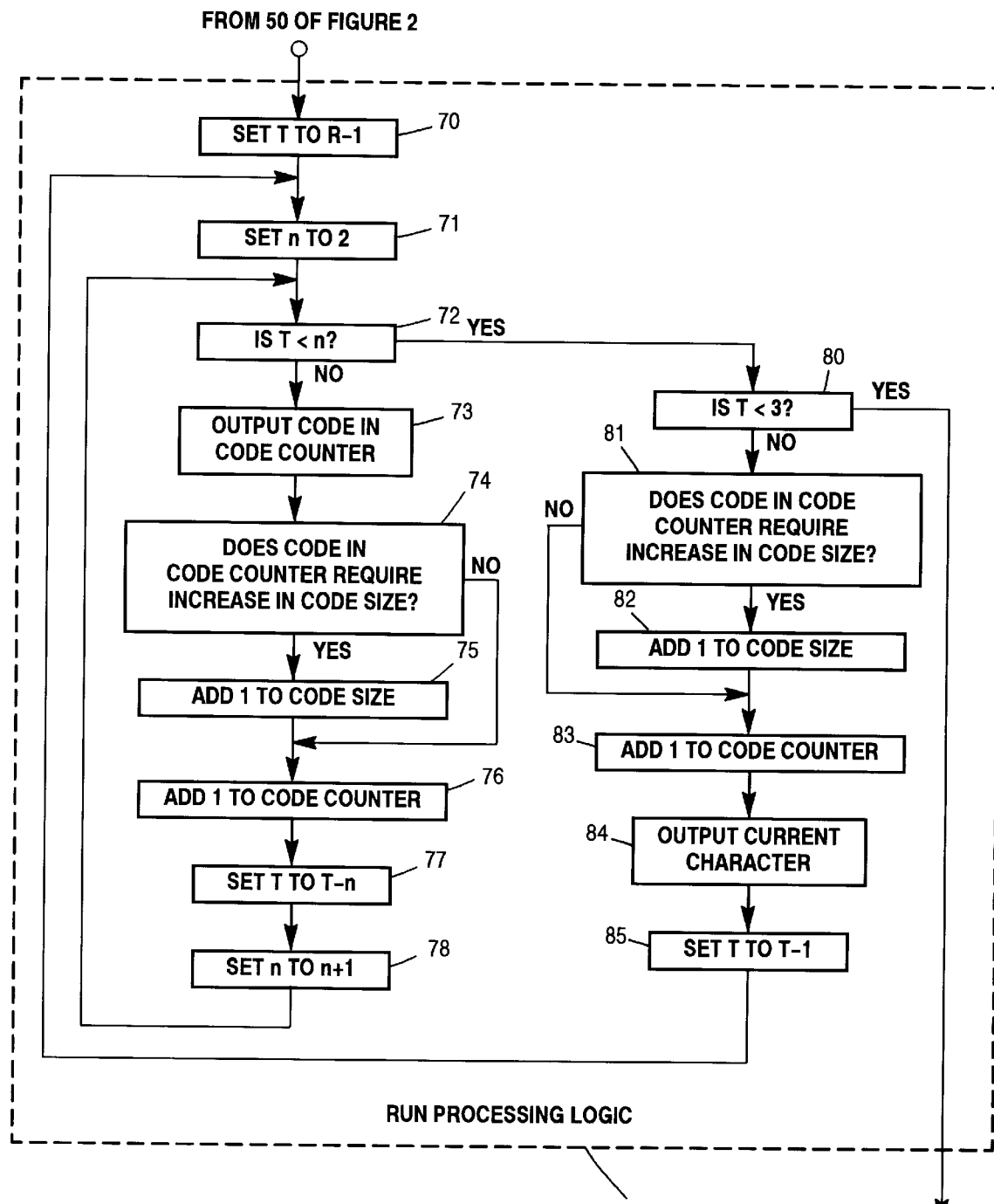
FIG. 3 is a control flow chart illustrating the run processing logic utilized in the flow chart of FIG. 2 so as to perform data compression in accordance with the iterative mathematical algorithm of the present invention.
Figure 4:
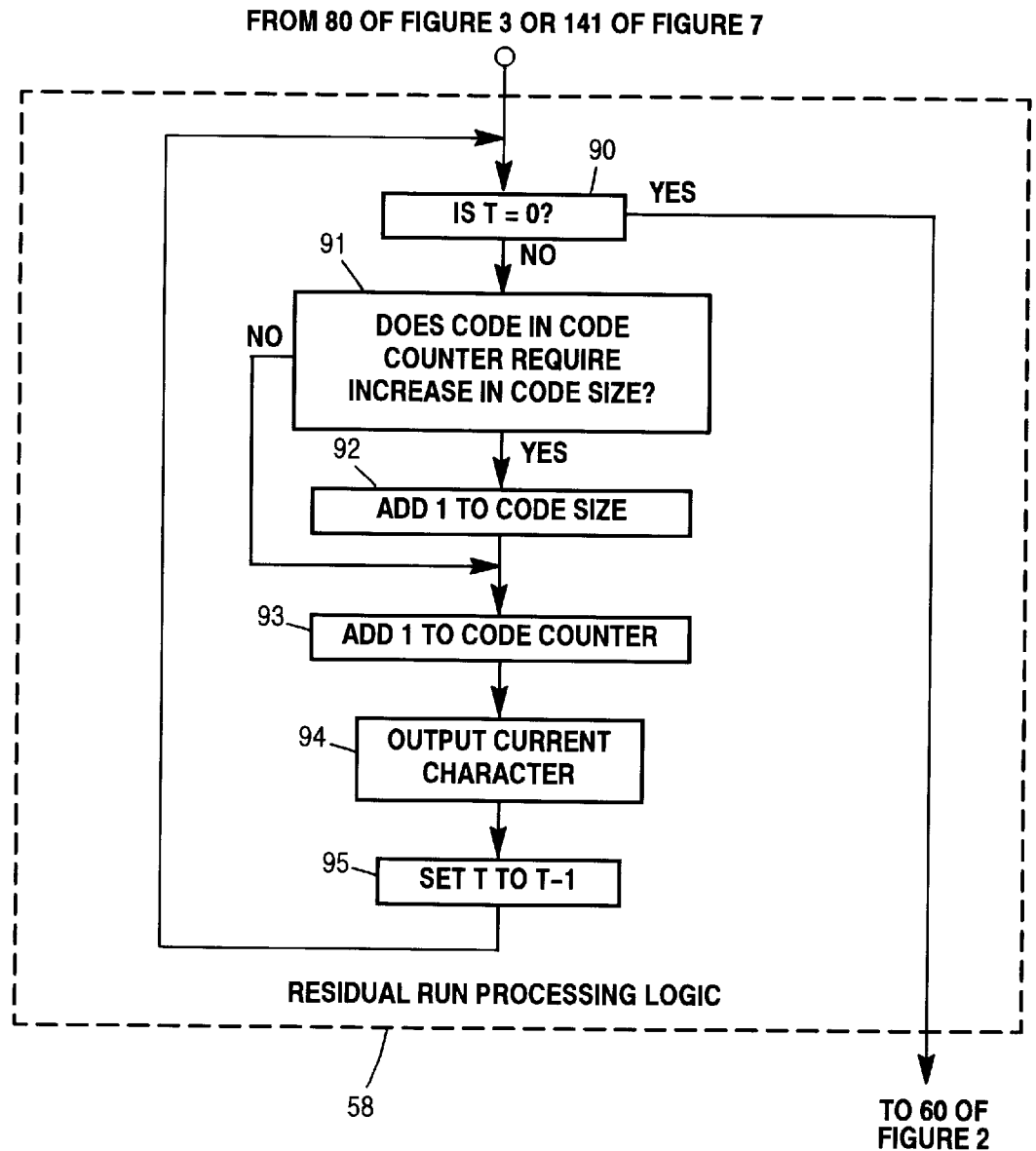
FIG. 4 is a control flow chart utilized in the flow chart of FIG. 2 to perform residual run processing.

The Current Character register 13, the Buffers 15 and 16, the registers 17–19, the Code Counter 22 and the logic 23–26 are utilized in performing the character run processing as explained below with respect to FIGS. 2–4. The control flow charts of FIGS. 2–4 illustrate the detailed operations to be executed by the compressor 10 so as to perform data compression in accordance with the invention. The control 27 is considered as containing appropriate circuitry such as state machines to control execution of the operations.

Referring to FIG. 2, with continued reference to FIG. 1, at a block 40, the Code Counter 22 is initialized to a first available code, for example, 258 in an ASCII environment. At a block 41, the Code Size register 14 is initialized to the beginning Code Size, for example, 9 bits in the ASCII embodiment.

At a block 42, the first input character is fetched into Current Character register 13 and at a block 43, the character in the Current Character register 13 is provided to the output 12. It is appreciated that even though this character has been output it still resides in the Current Character register 13.

Processing continues at a block 44 whereat the Current Character in the register 13 is tested against the next two look-ahead characters that follow Current Character to determine if they are the same. This process is performed by the logic 23 utilizing the appropriate characters fetched into the Look-Ahead Buffer 15.

The block 44 compares the Current Character to the next two look-ahead characters that follow Current Character to determine if a run of the same character is about to commence. If the Current Character is the same as the next two look-ahead characters, run processing begins by taking the YES branch of block 44. If one of the two look-ahead characters does not match Current Character, the NO branch of block 44 is taken to perform non-run processing.

It is appreciated in the logic of FIG. 2 that when the block 44 determines that a character run is about to occur (YES branch), the character in the Current Character register 13 should be output. Similarly, when the block 44 determines that a run is not about to occur (NO branch) that, again, Current Character should be output. For economy, since Current Character is output irrespective of which branch is taken, block 43 performs the action prior to the decision of block 44.

If the non-run processing NO branch is taken from the block 44, the Current Character has already been output at block 43. At a block 45, the code in Code Counter 22 is tested to determine if an increase in the Code Size is required. If so, processing continues to a block 46 whereat the Code Size register 14 is incremented by 1. If an increase in Code Size is not required, block 46 is bypassed to continue processing at a block 47. At block 47, the Code Counter 22 is incremented by 1 to maintain synchronism with the Current Character outputting of block 43.

Processing continues with a block 48 whereat the character following the Current Character is fetched to the Current Character register 13. Control then returns to the block 43 whereat the processing of the input data is continued.

When the decision of the block 44 indicates that a run of the same character is beginning, the YES branch is taken to a block 50. At the block 50, the R-register 17 is set to one plus the number of sequential characters that follow Current Character and are the same as Current Character. The run acquisition logic 24 is utilized to perform this function. Any buffering that is required in the run acquisition process is provided by the Run Buffer 16. It is appreciated that the characters of the run are acquired by the run acquisition logic 24 from the Input Character Buffer 30 via the bus 31 under control of the compressor 10 utilizing the control bus 32. Thus, the block 50 enters into the R-register 17, the number of characters in the run that is detected at the block 44. The Current Character register 13 holds the value of the run character.

Control continues at a block 54 schematically representing the run processing logic for computing a sequence of compressed codes that represent the run. In the FIG. 1 embodiment, the run processing logic 54 is implemented utilizing the control flow chart of FIG. 3. After processing all but, at most, two characters of the run, a residual run processing logic block 58 is entered to accommodate these residual one or two characters. The residual run processing logic of block 58 is implemented utilizing the control flow chart of FIG. 4.

After the run has been processed, control enters a block 60 whereat the R−1 characters of the run following Current Character are discarded. The character discard logic 26 is utilized to this effect. If these characters are held in the Run Buffer 16, the logic 24 clears the buffer. Since the run characters themselves are not utilized within the blocks 54 and 58, the function of the block 60 may be merely to set a flag (not shown) so that the next character processed is the character following the run. Thereafter, the Code Size test described above with respect to blocks 45 and 46 is performed at blocks 61 and 62. At a block 63, the Code Counter 22 is incremented by 1. At a block 64, under control of the logic 26, the next character that follows the characters that were discarded at the block 60 is fetched to the Current Character register 13 to continue the processing. Accordingly, control then returns to the block 43.

It is appreciated, in a manner to be described with respect to FIGS. 3 and 4, that the run processing logic 54 and the residual run processing logic 58 provide processing of the entire run. It is further appreciated that pursuant to the blocks 60 and 64 of FIG. 2, all of the run characters are thereafter discarded and processing is continued with the Current Character that follows the run.

In summary, it is appreciated that the decision block 44 detects the occurrence of a run and the run is processed in blocks 50, 54 and 58. The processing of the non-run data is performed by blocks 45–48. The blocks 60–64 perform the processing that follows after a run has been absorbed and processed.

Referring to FIG. 3, with continued reference to FIGS. 1 and 2, a control flow chart illustrating the details of the run processing logic 54 utilized in the FIG. 1 embodiment is illustrated. As discussed above, the run detected at the block 44 of FIG. 2 is comprised of R characters which are acquired by the logic 24 with the number of characters R set into the R-register 17 at the block 50. As further discussed above and in said Ser. No. 09/264,269, the run is considered comprised of the first character thereof held in the Current Character register 13 followed by contiguous numerically increasing segments of the same character. At a block 70, the variable T in the T-register 18 is set to R−1. At a block 71, the index n in the n-register 19 is set to 2.

In the logic to be described, the index n is iteratively incremented by 1 and iteratively subtracted from T until T (the number of characters remaining in the run to be processed) is less than n (the number of characters required in the next following contiguous run segment). For each such run segment mathematically found to exist in the run, the code in the Code Counter 22 is output and the Code Counter 22 incremented by 1.

Accordingly, processing continues at a block 72 whereat it is determined if T is less than n. If not, control proceeds to a block 73 whereat the code in Code Counter 22 is output. At blocks 74 and 75, the Code Size logic discussed above with respect to block 45 and 46 is performed. At a block 76, the Code Counter 22 is incremented by 1 to prepare the Code Counter 22 for the processing of the next segment of the run if T should remain sufficiently large to populate the segment.

Accordingly, at a block 77, T is set to T−n and, at a block 78, the index n is set to n+1. These actions are performed with respect to the registers 18 and 19, respectively. Control returns to block 72 to test the diminished value of T against the incremented value of n. It is appreciated that the computations and comparisons performed with respect to R, T and n at the blocks 70–72, 77 and 78, are performed by the logic 25 of FIG. 1.

When T has been diminished and n has been increased to the point where T is less than n, the YES branch from the block 72 is taken to a block 80. Block 80 determines if T is less than 3. If T is greater than or equal to 3, sufficient characters remain in the run to reset the loop represented by blocks 71–78 to process these remaining T characters of the run.

Accordingly, when T is greater than or equal to 3, the NO branch from block 80 is taken to blocks 81 and 82 whereat the Code Size logic discussed above with respect to blocks 45 and 46 is performed. At a block 83, the Code Counter 22 is incremented by 1 to maintain synchronism of the compressed code output.

In preparation for processing the remaining T characters of the run, the character in the Current Character register 13 is output at a block 84 and, accordingly, the value of T in the T-register 18 is set to T−1 at a block 85. Control then returns to block 71 whereat the index n in the n-register 19 is reset to 2.

After one or more iterations of the loop comprised of blocks 71–78, T will diminish to a value less than 3. When control enters block 80 with T less than 3, the YES branch of block 80 is taken to exit from the run processing logic 54. Processing then continues with the residual run processing logic 58 detailed in FIG. 4.

Referring to FIG. 4, with continued reference to FIGS. 1–3, details of the residual run processing logic 58 of FIG. 2 are illustrated. At a block 90, T is compared to zero and if T is not equal to zero (T will be 1 or 2), the NO branch from the block 90 is taken. The residual run characters are effectively processed as if they were non-run characters.

Accordingly, at blocks 91 and 92, the Code Size logic discussed above with respect to blocks 45 and 46 is performed. At a block 93, the Code Counter 22 is incremented by 1 and, at a block 94, the character in the Current Character register 13 is output.

At a block 95, the value of T in the T-register 18 is set to T−1 and processing returns to block 90. In this manner, the one or two residual characters of the run are processed and provided at the output 12 of the compressor 10.

When, at the block 90, T is equal to zero, all of the characters of the run have been processed. When this occurs, the YES branch from the block 90 is taken to continue the processing at the block 60 of FIG. 2.

It is appreciated in FIGS. 3 and 4 that the computations and comparisons performed with respect to R, T and n at the blocks 70–72, 77, 78, 80, 85, 90 and 95 are performed by the logic 25 of FIG. 1.

From the above, it is appreciated that a run is completely processed by the operations represented by FIGS. 2–4. Alternatively, the blocks 80–85 and 90–95 could be eliminated if the YES branch from the block 72 were returned directly to the block 60 of FIG. 2. Yet another alternative embodiment may be effected by eliminating the blocks 90–95 and returning the YES branch of the block 80 directly to the block 60 of FIG. 2. In both of these alternative embodiments, the discarded characters in the blocks 60 and 64 would be R−(T+1) rather than R−1.

Referring to FIG. 5, with continued reference to FIGS. 1–4, an example of the operation of the compressor 10 in accordance with the flow charts of FIGS. 2–4 is illustrated. At the top of the figure, an input data character stream is shown where the characters of each character run are identified by character sequence numbers. This is done to facilitate following the progress of the characters through the steps of the example. It is appreciated that these sequence numbers are shown for purposes of character identification and do not appear in the actual data character stream.

The example is largely self-explanatory, with the actions performed delineated in the left-hand column and the blocks of FIGS. 2–4 that participate in the actions designated in the right-hand column. It is noted that the run of the character "b" is 90 characters long.

In action 1, the Code Counter and Code Size are initialized in blocks 40 and 41 of FIG. 2, the first character "a(1)" is fetched to Current Character at the block 42 and is output at the block 43. At the block 44, the run of the character "a" is detected by determining that the next two look-ahead characters "a(2)" and "a(3)" are the same as Current Character. In block 50, the parameter R is set to 13, which is the number of characters in the run, and in blocks 70 and 71 the variables T and n are set.

In actions 2–4, the loop comprised of blocks 72–78 of FIG. 3 process the run up to the character "a(10)". In actions 5 and 6, the remainder of the run is processed utilizing the loop comprising blocks 80–85 of FIG. 3. In action 6, the characters "a(2)"–"a(13)" are discarded.

In actions 7–11, non-run processing is performed primarily utilizing the loop of FIG. 2 comprised of blocks 43–48.

In actions 12–23 the 90 character run comprised of the character "b" is processed as indicated. It is noted that actions 12–17 absorb 77 characters of the run utilizing the loop comprised of blocks 72–78 of FIG. 3. Actions 18–21 illustrate recursively utilizing the loop comprised of blocks 72–78 as reset by the blocks 80–85. Actions 22 and 23 illustrate processing the remainder of the 90 character run utilizing the residual run processing of blocks 90–95 of FIG. 4.

More detailed descriptions of the actions of FIG. 5 relative to the blocks of FIG. 2–4 are readily apparent and will not be provided for brevity.

Referring to FIG. 6, with continued reference to FIG. 1, a schematic block diagram of an alternative preferred embodiment of the present invention is illustrated. FIG. 6 illustrates a data compressor 100 having a number of components that are the same as those described above with respect to FIG. 1 and which are given the same reference numerals as in FIG. 1. The descriptions thereof provided above with respect to FIG. 1 are applicable to FIG. 6.

Figure 7:
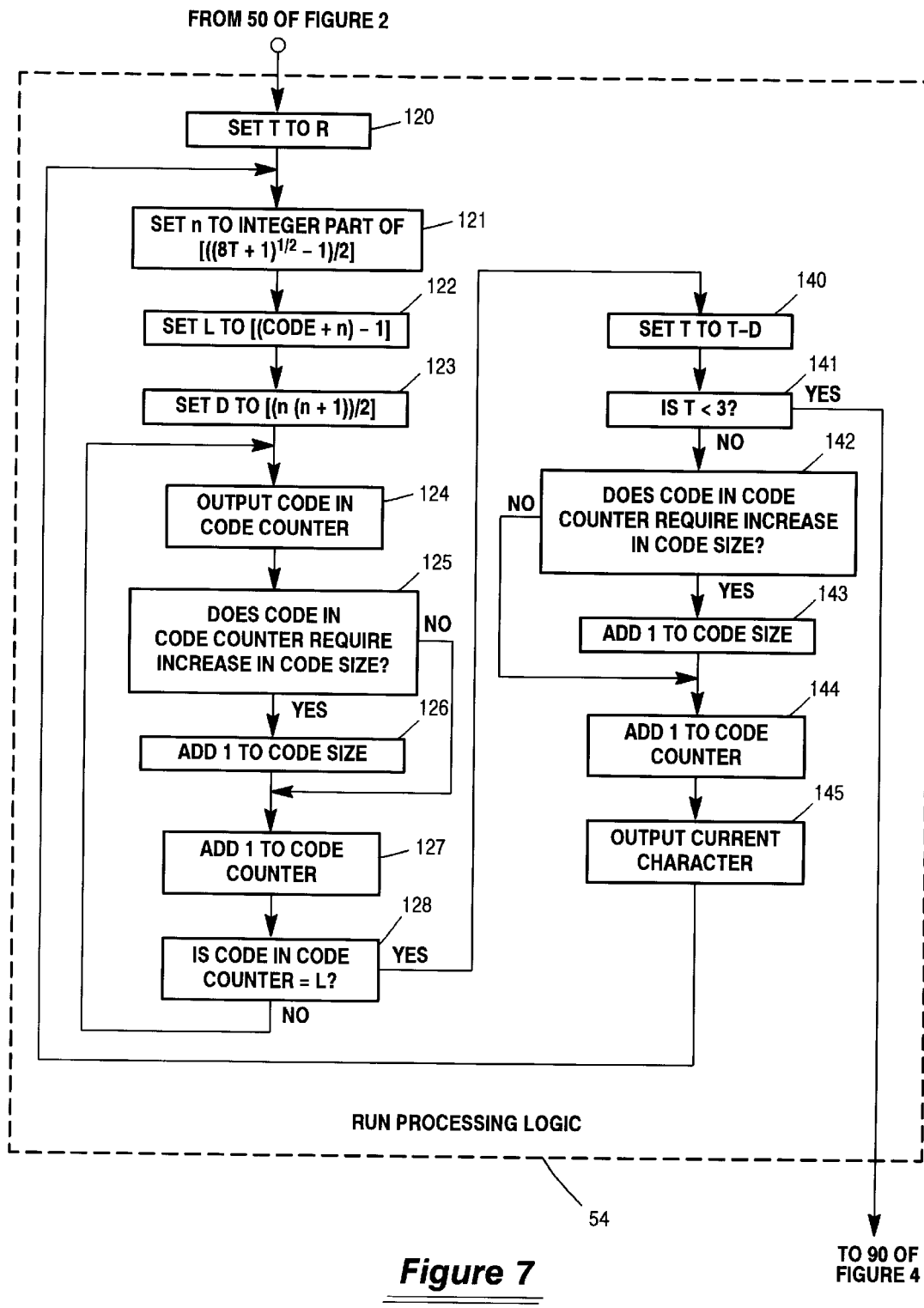
FIG. 7 is a control flow chart illustrating the run processing logic of FIG. 2 when utilized in the FIG. 6 embodiment so as to perform data compression in accordance with the quadratic equation mathematical algorithm of the present invention. The residual run processing logic of FIG. 4 is also utilized in the control flow chart of FIG. 2 when run processing is performed pursuant to FIG. 7.

The compressor 100 also includes working registers denoted as an L-register 101 and a D-register 102 for holding variables used in the operation of the compressor 100 in a manner to be described with respect to FIG. 7. The compressor 100 further includes n-computation logic 103, T-computation logic 104, L-computations logic 105 and D-computation logic 106 for processing runs in a manner to be described with respect to FIG. 7. The compressor 100 also includes control 107 for controlling the operations of the compressor 100 in accordance with the operational flow charts of FIGS. 2, 4 and 7 in a manner to be described.

Briefly, the operation of the compressor 100 is the same as the operation described above with respect to the compressor 10 except in the manner in which run processing is performed. As described above, the operational flow chart of FIG. 2 also applies to the compressor 100 with the run processing logic 54 implemented by the operational flow chart of FIG. 7. A run is processed by applying an equation to the number of characters in the run to determine the number of segments that exist in the run. A further equation is utilized to determine a count for the Code Counter 22 to attain so as to provide codes to represent these segments. A further equation, of the quadratic type, is applied to determine the number of characters that will be processed and therefore discarded. The Code Counter 22 is sequentially incremented and the codes therein output until the Code Counter 22 attains the count determined by the equations.

After performing this process, the computed number of characters to be discarded is subtracted from the number of characters of the run and if three or more characters remain to be processed, the character residing in the Current Character register 13 is output and the Code Counter 22 is again advanced by 1. The computational process is reset by applying the number of the remaining characters in the run to the equations until less than three run characters remain. When this occurs, the residual run processing logic described above with respect to FIG. 4 is invoked.

The Current Character register 13, the Buffers 15 and 16, the registers 17–19, 101, 102, the Code Counter 22 and the logic 23, 24, 26 and 103–106 are utilized in performing the character run processing as explained below with respect to FIGS. 2, 4 and 7. The control flow charts of FIGS. 2, 4 and 7 illustrate the detailed operations to be executed by the compressor 100 so as to perform data compression in accordance with the invention. The descriptions given above with respect to FIGS. 2 and 4 also apply to the compressor 100 except that the run processing logic 54 is performed by the operational flow chart of FIG. 7. The control 107 is considered as containing appropriate circuitry such as state machines to control execution of the operations.

Referring to FIG. 7, with continued reference to FIGS. 2, 4 and 6, a control flow chart illustrating the details of the run processing logic 54 utilized in the FIG. 6 embodiment is illustrated. Before describing the details of FIG. 7, it should be appreciated that the illustrated computations are based on the equation for the sum of the first n numbers as follows:

$$S(n)=1+2+3+4+\ldots+n=[(n(n+1))/2].$$

As discussed above, a run can be considered as comprised of contiguous numerically increasing run segments where the first segment of a single character is held in the Current Character register 13. Following Current Character are contiguous run segments of 2 characters, 3 characters, 4 characters, ..., n characters. It is appreciated that further characters can exist in the run, but the number of further characters will be less than n+1. It is therefore appreciated that R, the number of characters in the run, will be equal to S(n) plus the number of further characters. It is furthermore appreciated that the above given quadratic equation in n can be solved for n in terms of S utilizing the quadratic equation solution for obtaining the roots thereof. One root of the equation is:

$$n=[((8S+1)^{1/2}-1)/2].$$

It is observed that when this equation for n is applied to the number of characters in a run, the integer part of the right-hand side of the equation yields the largest run segment in the contiguous sequence of segments that exists in the run. In a manner to be described, this number is used to obtain the sequence of codes from the Code Counter to represent the respective contiguous segments of the run. This number is also used in processing the remaining characters of the run in a manner to be described.

With continued reference to FIG. 7, at a block 120, the variable T in the T-register 18 is set to R. Thus, at this point, the variable T represents the number of the characters in the run that was detected at the block 44 of FIG. 2.

Processing proceeds to a block 121 where, using the logic 103 of FIG. 6, T is utilized in the above equation for n to provide:

$$n=\text{Integer Part of } [((8T+1)^{1/2}-1)/2].$$

Thus, the block 121 generates the variable n that provides the number of characters in the largest segment of characters that exists in the contiguous segment sequence of the run and also provides an indication of the number of such segments comprising the run.

Accordingly, at a block 122, n is utilized to derive the variable L representing the code in the Code Counter 22 that is next available after codes have been assigned from the Code Counter 22 to the contiguous respective segments of the run in a manner to be described. The logic 105 of FIG. 6 is utilized to derive L as follows:

$$L=[(\text{code}+n)-1]$$

where code is the code existing in the Code Counter 22 when control enters block 122.

Processing proceeds to a block 123 where a variable D is derived utilizing the logic 106 of FIG. 6. The variable D represents the number of characters in the run that are currently being processed. D therefore represents the sum of the characters of the run in the contiguous run segments comprising 1 character, 2 characters, 3 characters, 4 characters, ..., n characters. The logic 106 provides D as follows:

$$D=[(n(n+1))/2].$$

The variable D will be utilized, in a manner to be described, to process further characters in the run.

Processing proceeds to a block 124 whereat the code in Code Counter 22 is output. This code represents one of the segments in the run that is being processed. Thereafter, the Code Size test described above with respect to blocks 45 and 46 is performed at blocks 125 and 126. At a block 127, the Code Counter 22 is incremented by 1.

At a block 128, the code in the Code Counter 22 is compared to L to determine if all of the codes have been assigned to the respective segments of the run. If the code in the Code Counter 22 is not equal to L, the NO branch returns to the block 124 to continue the process.

It is appreciated that the loop comprised of the blocks 124–128 output a sequence of codes representative, respectively, of the sequence of segments mathematically determined in the blocks 121–123 to exist in the detected run. When the code in the Code Counter 22 attains the value L, the YES branch from the block 128 is taken to a block 140.

At the block 140, the variable T in the T-register 18 is set to T−D. Thus, the variable T has been reset so as to mathematically process remaining characters in the run.

Accordingly, at a block 141, T is compared to 3. If T is greater than or equal to 3, further processing of the detected run may be performed utilizing the blocks 121–128. Thus, if T is greater than or equal to 3, the NO branch from the block 141 is taken to blocks 142 and 143 whereat the Code Size logic discussed above with respect to blocks 45 and 46 is performed. At a block 144, the Code Counter 22 is incremented by 1 and, at a block 145, the character in the Current Character register 13 is output. Control is then returned to block 121 wherein the value of T derived at the block 140 is utilized as described above with respect to the blocks 121–128 to generate further codes corresponding to segments in the run. It is appreciated, however, that when control returns to the blocks 121–128 from the block 145, the mathematical process of these blocks is applied to a run of length T–D.

It is appreciated that the blocks 141–145 perform functions similar to those described above with respect to the blocks 80–84 of FIG. 3.

When the variable T has been diminished at block 140 to a value less than 3, the YES branch from block 141 is taken to the residual run processing logic 58 of FIG. 4. The residual run processing is performed as described above with respect to FIGS. 2–4.

In a manner similar to that described above with respect to the FIGS. 1–4 embodiment, the FIGS. 2, 4, 6 and 7 embodiment may provide a further embodiment by eliminating the blocks 140–145 of FIG. 7 and the blocks 90–95 of FIG. 4 and returning the YES branch of the block 128 to the block 60 of FIG. 2. In this embodiment the discarded characters of blocks 60 and 64 would be D−1 rather than R−1.

Again, in a manner similar to that described above, a still further embodiment may be realized by eliminating the blocks 90–95 of FIG. 4 and returning the YES branch of block 141 to block 60 of FIG. 2. In this embodiment, the discarded characters in the blocks 60 and 64 would be R−(T+1) rather than R−1.

Referring to FIG. 8, with continued reference to FIGS. 2, 4, 6 and 7, an example of the operation of the compressor 100 in accordance with the flow charts of FIGS. 2, 4 and 7, is illustrated. The format of FIG. 8 is similar to that of FIG. 5 and descriptions given above with respect to FIG. 5 are applicable. The same data character stream illustrated in FIG. 5 is utilized in FIG. 8.

In action 1, initialization occurs generally as described with respect to FIG. 5 with the run-length parameter R being set at the block 50. The parameter T is set to R at block 120 and the parameters n, L and D are set utilizing the equations of blocks 121–123.

In actions 2–4, the "a" run is processed up to character "a(10)". The processing is effected by iterations of the loop comprised of blocks 124–128. At action 4, the Code Counter 22 attains the value L and block 128 transfers control to block 140. In actions 5 and 6, the remainder of the "a" run is processed as illustrated. Actions 7–11 depict the non-run processing as described above with respect to FIG. 5.

In actions 12–23, the 90 character run comprised of the character "b" is processed as illustrated. At action 12, the initial parameters for the processing are mathematically established as indicated. It is noted that actions 12–16 absorb 77 characters of the run by iteratively utilizing the loop comprised of blocks 124–128. It is appreciated that the operation of the loop is basically incrementing and outputting the Code Counter until the Code Counter equals L. Action 17 re-initiates the loop so as to further process the run in actions 18 and 19. Actions 21 and 22 illustrate processing the remainder of the 90 character run utilizing the residual run processing of blocks 90–95 of FIG. 4.

More detailed descriptions of the actions of FIG. 8 relative to the blocks of FIGS. 2, 4 and 7, are readily apparent and will not be provided for brevity.

The FIG. 1 and FIG. 6 embodiments described above together with the applicable operational flow charts utilize two distinctly different algorithms. The FIG. 1 embodiment utilizes the iterative process described, whereas the FIG. 6 embodiment utilizes the quadratic equation embodiment discussed above. It is noted with respect to FIGS. 5 and 8 that the same input data character stream results in the same compressed code output stream in both embodiments.

Referring to FIG. 9, with continued reference to FIGS. 1–4, a schematic block diagram of an alternative preferred embodiment of the present invention is illustrated. FIG. 9 illustrates a data compressor 200 having a number of components that are the same as those described above with respect to FIG. 1 and which are given the same reference numerals as in FIG. 1. The descriptions thereof provided above with respect to FIG. 1 are applicable to FIG. 9.

The compressor 200 includes Look-Ahead Buffer 201, Run Buffer 202, look-ahead comparison logic 203, run acquisition logic 204 and character discard logic 205. The components 201–205 are similar to the respective components 15, 16, 23, 24 and 26 as described above with respect to FIG. 1. Additional functionality for these components is required in the compressor 200 of FIG. 9 which will be described with respect to FIG. 11. The compressor 200 further includes working registers denoted as a D-register 206 and an M-register 207 and a T-register 208 for holding variables used in the operation of the compressor 200 in a manner to be described with respect to FIG. 11.

The compressor 200 also includes R, T, D, n and M computations logic 210 for performing the computations to be described with respect to FIG. 11. The compressor 200 also includes control 215 for controlling the operations of the compressor in accordance with the operational flow chart of FIG. 11 in a manner to be described.

The compressor 200 utilizes a run processing algorithm similar to the iterative mathematical algorithm described above with respect to FIG. 1 and illustrated in FIG. 3. Unlike the compressor 10 of FIG. 1, the compressor 200 of FIG. 9 includes Tables and Flags 220 for storing run segment counts and codes and for providing First Encounter Flags in a manner to be described. Data communication with the Tables and Flags 220 is effected by a bi-directional bus 221. Control of the data transfer is effected by a control bus 222. Details of the Tables and Flags 220 are provided in FIG. 10.

Referring to FIG. 10, the Tables and Flags 220 include a Run Segment Table 225 and a First Encounter Flag 226 for each of the characters of the alphabet over which compression is occurring. For example, the Run Segment Table 225 for "Character 1" stores the counts and codes of the run segments of the runs of "Character 1" that are encountered in the data character input. Initially, all of the First Encounter Flags 226 are set. When a run of "Character 1" is first encountered, the First Encounter Flag 226 for "Character 1" is reset. Details of the use of the Tables and Flags 220 of FIG. 10 will be described below with respect to FIG. 11.

Briefly, the operation of the compressor 200 is as follows. The compressor 200 generally utilizes the same run processing algorithm as described above with respect to the compressor 10 except that in the compressor 200 run segment data is stored in the Tables 225 as the segments of the run are mathematically determined. In later encounters of a run of the same character, the stored data is utilized to enhance the compression. In order to optimize the use of the stored data, the recursive control blocks 80–85 of FIG. 3 and the residual run processing logic of FIG. 4 are not utilized in FIG. 11. Instead, when a run is first encountered, logic similar to blocks 71–78 of FIG. 3 is utilized to process and store the run segment data for most of the run with the remainder of the run utilizing the stored data in a manner to be explained with respect to FIG. 11.

Because of the differences in operation, the run detection logic of the compressor 200 operates somewhat differently from the run detection logic of the compressor 10. In the compressor 200, if Current Character is not the same as the next following character, non-run processing is performed in substantially the same manner as the non-run operations of the compressor 10. If the next character is the same as Current Character, the First Encounter Flag for Current Character is tested. If the compressor 200 is encountering a run of Current Character for the first time, run processing similar to that of compressor 10 is performed but including the run segment data storage and non-recursive use of the algorithm. In this case, Current Character and the next two characters would be the same. If, however, this encountered run of Current Character is not the first such run, the Run Segment Table 225 for Current Character is consulted in the processing of the run.

The Current Character register 13, the Code Counter 22, the Buffers 201 and 202, the R-register 17, the D-register 206, the n-register 19, the M-register 207, the T-register 208 and the logic 203–205 and 210 are utilized in performing the character run processing as described below with respect to FIG. 11.

Referring to FIG. 11, with continued reference to FIGS. 9 and 10, a control flow chart is illustrated showing the detailed operations to be executed by the compressor 200. The control 215 is considered as containing appropriate circuitry to control execution of the operations. In the manner described above, the flow chart of FIG. 11 is predicated on a variable length output. Many of the blocks of FIG. 11 are the same as the blocks of FIGS. 2 and 3 and are designated by the same reference numerals. The descriptions given above with respect to these blocks of FIGS. 2 and 3 are also applicable to the similarly numbered blocks of FIG. 11. Only the blocks of FIG. 11 that are different from the blocks of FIGS. 2 and 3 will be emphasized in the following description of FIG. 11.

At blocks 40–42 of FIG. 11, the Code Counter 22 and Code Size register 23 are initialized and the first character is fetched to the Current Character register 13. At a block 230, all of the First Encounter Flags 226 are set in preparation of the first encounter of a run of a character.

Processing continues at a block 231 whereat the character in the Current Character register 13 is compared to the next following character to determine if they are the same. The Look-Ahead Buffer 201 and the logic 203 are used to perform this function. If the characters are not the same, the NO branch is taken from the block 231 to perform non-run processing. If the two characters are the same, the YES branch from the block 231 is taken to a block 232 whereat the state of the First Encounter Flag 226 for the character in the Current Character register 13 is tested. If the First Encounter Flag has been reset, the YES branch from the block 232 is taken to perform run processing of the Current Character where a run of this character has previously been encountered and the run data has been stored in the Run Segment Table 225 for the character.

If the First Encounter Flag 226 for Current Character is still set, the NO branch from the block 232 is taken to the block 44. The block 44 determines if Current Character and the next two look-ahead characters are the same. The Look-Ahead Buffer 201 and the logic 203 are utilized to perform this function. Since the First Encounter Flag for Current Character is still set, run data for this character has not yet been stored. Under these conditions, if the YES branch from the block 44 is taken, run processing similar to that of FIG. 3 is performed. If the NO branch from the block 44 is taken, non-run processing is performed.

Thus it is appreciated, that the blocks 44, 231 and 232 function to detect runs in the following manner. If Current Character is different from the following character, non-run processing is performed. If Current Character is the same as the following character and a run for this character has previously been processed, run processing is performed utilizing the previously stored data. If a run of the character has not yet been encountered and processed, run processing is performed if Current Character is the same as the next two characters, otherwise non-run processing is performed.

If the NO branch is taken either from block 44 or block 231, non-run processing is performed. At a block 233, the character in Current Character register 13 is output. Thereafter, the non-run processing of blocks 45–48 is performed in the manner described above with respect to FIG. 2. At block 48, processing returns to block 231.

When a three-character run of Current Character has been detected for the first time, the YES branch from block 44 is taken. Processing continues with a block 234 whereat the First Encounter Flag for Current Character is reset. At a block 235, the T-register 208 is set to the number of sequential characters that follow Current Character and are the same as Current Character. The run acquisition logic 204 and Run Buffer 202 are utilized to perform this function. Processing continues with blocks 236 and 237 whereat the character in the Current Character register 13 is output and the variable D in the D-register 206 is set to zero, respectively. The variable D in the D-register 206 maintains a count of characters to be discarded in a manner to be described.

Control then enters a loop for mathematically processing the segments of the run in the manner described above with respect to the blocks 71–78 of FIG. 3 with two differences. In FIG. 11, a block 240 is interposed between the blocks 73 and 74 and a block 241 is interposed between the blocks 76 and 77. At the block 240, the code from the Code Counter 22 and the count equal to n is stored in the Run Segment Table 225 for the Current Character. At block 241, the variable D is set to D+n.

Thus, by iterations of the loop comprised of the blocks 72–78, 240 and 241 the contiguous, numerically increasing segments of the run are processed. At the block 73, the code representing each segment is output and the code and character count of each segment is stored in the Run Segment Table at the block 240. At the block 241, the number of characters in each processed segment is added to D so that when the processing of the loop is concluded the characters of the processed segments are discarded. Processing of the loop is concluded when T is less than n as detected at the block 72.

Accordingly, the YES branch from the block 72 directs the processing to a block 245 at which the D character or characters following Current Character are discarded. Processing continues at blocks 246 and 247 whereat the Code Size test is performed as discussed above with respect to blocks 45 and 46. At a block 248, the Code Counter 22 is incremented by 1 to maintain synchronism with the non-run processing. At a block 249, the character that follows the D character or characters discarded at the block 245 is fetched to the Current Character register 13. The character discard processing of block 245 and the Current Character fetching of block 249 are performed by the logic 205 and the Buffer 202 of FIG. 9 using the value of D in the D-register 206 to discard the appropriate characters and to fetch the appropriate character as indicated. Thereafter, control returns to the block 231 to continue processing the input data character stream.

With reference to FIG. 10 and continued reference to FIG. 11, operation of the blocks 71–73, 240 and 241 of FIG. 11 may be exemplified by a run of "Character 1" as indicated in FIG. 10. "Character 1" is in the Current Character register 13 and this is the first encounter of a 3-character run of "Character 1". Consecutive iterations of the loop of FIG. 11 comprising the blocks 72–78, 240 and 241 result in the entries in the Run Segment Table 225 for "Character 1" at codes 258–267. Thus it is appreciated that as n is advanced at block 78, numerically increasing segments of the run of "Character 1" are mathematically processed with the run segment data stored as illustrated in the Table 225. As discussed above, the code representing each segment of the run is output at the block 73.

Thus it is seen, that this exemplified run of "Character 1" is comprised of Current Character in the Current Character register 13, followed by a run segment of two characters represented by code 258, followed by a run segment of three characters represented by code 259, and so forth, up to a segment of eleven characters represented by code 267. Thus, this run is comprised of between 66 and 77 characters.

When a two-character run is encountered in the block 231 and the First Encounter Flag for the character has been reset, the YES branch is taken from the block 232 to a block 260 to begin run processing of a run of a character where previous run data for the character has been stored. A parameter R is set to 1 plus the number of sequential characters that follow Current Character and that are the same as Current Character. Thus, R is equal to the number of characters in the run of Current Character that has just been encountered. The run acquisition logic 204 together with the Run Buffer 202 are utilized in performing the functionality of the block 260 where the value of R is held in the R-register 17.

Processing continues to a block 261 where a parameter M is set to the maximum count in the Run Segment Table for the character in the Current Character register 13. M is determined from the appropriate Run Segment Table 225 of FIG. 10 by scrolling to the bottom of the Table to determine this maximum count of M. M is then held in the M-register 207.

Processing continues at a block 262 whereat the value in the R-register 17 is compared with the value in the M-register 207. If R is greater than M, the YES branch from the block 262 is taken and if R is less than or equal to M, the NO branch from the block 262 is taken. If the YES branch is taken, the currently encountered run of Current Character is greater than the maximum run segment stored in the associated Run Segment Table 225. If the No branch is taken, the currently encountered run of Current Character is less than or equal to the maximum run segment stored in the associated Run Segment Table.

If the NO branch is taken from the block 262, processing continues at a block 263 whereat the code from the associated Run Segment Table for the count that is equal to R is output by the compressor 200. The function of block 263 is performed by associatively comparing the value in the R-register 17 with the counts in the associated Run Segment Table. When R is located in the Table, the corresponding code has been located and is output. Alternatively, a simple sequencing through the counts stored in the Table can be utilized to find the appropriate location where the count is equal to R.

Processing then proceeds to a block 264 whereat the value of the variable D in the D-register 206 is set to R−1. Thereafter control proceeds to block 245 where the D character or characters is discarded as previously described.

If the currently encountered run of Current Character is greater than the longest run segment stored in the associated Run Segment Table 225, the YES branch is taken from the block 262. Processing continues with a block 265 whereat the code corresponding to M from the associated Run Segment Table is output. M is the value stored in the M-register 207. The associated Run Segment Table is accessed with this value of M either, for example, associatively or by scanning to locate and output the corresponding code for the count of M.

Processing continues at a block 266 whereat the variable D in the D-register 206 is set to M−1 so that these characters may be discarded when processing enters block 245 as discussed above. The M−1 characters discarded together with the character in the Current Character register 13 comprise a segment of the currently encountered run of Current Character. The code representing these M characters was outputted at block 265.

The remainder of the run is processed by setting T in the T-register 208 to R−M at a block 267 and by setting n in the n-register 19 to M+1 at a block 268. The function of the block 267 is performed by subtracting M in the M-register 207 from R in the R-register 17 and transferring this value to the T-register 208. The function of the block 268 is performed by incrementing the value of M in the register 207 by 1 and transferring this value to the n-register 19. Control then transfers to the block 72 to continue the processing of the run as previously described.

With continued reference to FIG. 11, it is appreciated that block 233 is the entrance to non-run processing and block 234 is the entrance to processing of a first encountered run of a character. The block 260 is the entrance to the processing of a run of a character where a previous run of the character has been processed and stored. For such a run, the block 262 is the branch point for processing runs that are either greater than the maximum run segment stored or less than or equal to the maximum stored run segment.

It is appreciated in FIG. 11 that the recursive re-entry of the loop comprised of the blocks 72–78 as reset by the blocks 80–85 of FIG. 3 is not utilized. This is done to advantageously utilize the stored data of a first encountered run for the remaining characters of the run where the remaining characters are insufficient to populate a next numerically increasing run segment. An enhancement in compression should be realized by this approach.

FIG. 11 was described in terms of the run detection logic comprised of the blocks 231, 232 and 44. It is appreciated that block 231 could be eliminated and the processing order of blocks 44 and 232 reversed with the result that the stored run segments of length 2 would not be accessed in the Run Segment Tables 225.

The embodiment of the invention explained with respect to FIGS. 9–11, that utilizes storage of run segment data, was described in terms of the iterative mathematical algorithm of FIG. 3. It is appreciated that a similar storage embodiment can be realized utilizing the quadratic equation embodiment of FIG. 7. In such an embodiment the Run Segment Tables would be mathematically generated utilizing the given equations.

Referring to FIG. 12, with continued reference to FIGS. 9–11, an example of the operation of the compressor 200 in accordance with the flow chart of FIG. 11 is illustrated. The format of FIG. 12 is similar to that of FIG. 5 and descriptions given above with respect to FIG. 5 are applicable. In FIG. 12, the depicted input data character stream utilizes runs of the character "a" so as to illustrate the storage operations. FIG. 12 differs from FIG. 5 principally in that run segment data stored in the Run Segment Table and used to process later runs is illustrated and the parameters D and M, as well as the setting and resetting of the First Encounter Flag, are shown. Additionally as discussed above, the processing loop of blocks 72–78 of FIG. 11 are not used recursively as in FIG. 3.

In action 1, initialization occurs with the First Encounter Flag set and the first character "a(1)" fetched to Current Character. Since the run of character "a" is encountered for the first time, action 2 illustrates the First Encounter Flag being reset, Current Character being output and the parameters T, D and n being set as described above with respect to blocks 234–237 and 71 of FIG. 11. In actions 3–5, the run is processed up to character "a(10)" iteratively utilizing the loop comprised of blocks 72–78, 240 and 241. Actions 3–5 illustrate the storage of the run segment data.

Action 6 illustrates processing the remaining characters "a(11)" and "a(12)" of the run by accessing the Run Segment Table for the two-count segment having the corresponding code of 258.

The non-run processing of actions 7–10 of FIG. 12 are substantially the same as actions 7–11 of FIG. 5, except that in FIG. 12, the non-run decision is made on the basis of one look-ahead character, whereas in FIG. 5, the decision is made on the basis of two look-ahead characters.

Actions 11 and 12 of FIG. 12 illustrate the detection and processing of the second encounter of a run of the character "a". This run is illustrated as characters "a(13)" through "a(21)" and is thus comprised of nine characters. The largest segment of a run of the "a" character was stored at action 5 with a run segment count of four. In action 11, the code 260 for the stored segment is output and the parameters R, T, D, n and M are set in blocks 260–268 of FIG. 11 with the values as depicted. Action 12 illustrates the processing of blocks 72–78, 240, 241 and 245 of FIG. 11 wherein the appropriate code is output, the run segment data is stored and the characters "a(14)" through "a(21)" are discarded to complete the processing of the run.

The correlation of the actions of FIG. 12 with the blocks of FIG. 11, as indicated in the right-hand column of FIG. 12, is similar to the descriptions given above and are readily apparent by a comparison of the specific example of FIG. 12 with the functionality of the blocks of FIG. 11.

It is appreciated that for the same input, the non-storage embodiments described above provide the same output. This has previously been discussed with respect to FIGS. 5 and 8. The same observation may be made with respect to storage embodiments configured as described above. It is furthermore appreciated that, for the same input, storage and non-storage embodiments of said Ser. No. 09/264,269 will also provide the same respective outputs. This is appreciated by a comparison of FIG. 12 of the present application with FIG. 7 of said Ser. No. 09/264,269.

It is appreciated that a compatible decompressor can readily be provided that receives the compressed output of the compressor 10, 100 or 200 operating in synchronism therewith to recover the input data characters corresponding thereto.

If the sequence of output codes, as delineated in the "OUTPUT" columns of FIGS. 5, 8 and 12 are processed by the decompressor, the input data character streams, illustrated in the drawings, will be recovered. It is understood that the protocols of the decompressor should be compatible with those of the compressor. In the examples of FIGS. 5, 8 and 12, an ASCII alphabet supported by eight bits is assumed. The ASCII alphabet is comprised of 256 characters. The Code Counter 22 is initialized at block 40 of FIGS. 2 and 11 to a code of 258. The code 257 may, for example, be reserved as a control code as is well understood in the art. The decompressor should have the same alphabet size and initial conditions, such as initial Code Counter value and initial Code Size, as the compressor. Furthermore, as is well appreciated in the art, the Code Size of the compressor embodiments of the present invention and the Code Size of the decompressor should be advanced in synchronism with respect to each other, for example, as described above with respect to FIGS. 2–4.

As is well known, the compressor and decompressor can either be initialized with all of the single character strings or single characters can be distinguished from compressed codes by the respective values thereof. An ASCII character has a value that is equal to or less than 256, whereas in the ASCII examples of FIGS. 5, 8 and 12, compressed codes have a value equal to or greater than 258. It is furthermore well known that other single character code protocols may also be utilized.

The single character code protocol that is used in the compressor embodiments of the present invention should also be utilized in the decompressor.

It is appreciated that the Code Counter 22 is incremented as described above so as to maintain synchronism between the run and non-run processing. This is particularly seen at blocks 47, 63, 76, 83, 93, 127, 144 and 248 of the above described figures. For example in FIG. 2, at block 47 the Code Counter 22 is incremented by 1 so as to maintain synchronism with the Current Character outputting of block 43.

The above embodiments compress a stream of input data characters. The input data characters can be over any size alphabet having any corresponding character bit size. For example, the data characters can be textual, such as ASCII characters, over an alphabet, such as the 256 character ASCII alphabet of eight-bit characters. The input data can also be binary characters over the two character binary alphabet 1 and 0 having a one-bit sized character. It is appreciated that textual data can also be compressed over the two character alphabet of the underlying binary data.

It is appreciated that the above-described embodiments of the invention may be implemented in hardware, firmware, software or a combination thereof. Discrete circuit components may readily be implemented for performing the various described functions. In a software embodiment, appropriate modules, programmed with coding readily generated from the above-described flow charts, may be utilized.

While the invention has been described in its preferred embodiments, it is to be understood that the words which have been used are words of description rather than of limitation and that changes may be made within the purview of the appended claims without departing from the true scope and spirit of the invention in its broader aspects.

What is claimed is:

1. A data compression method for compressing an input stream of data characters into an output stream of codes, said input stream including adjacent data characters which, if the same with respect to each other, form a run of the same data character, said method comprising detecting when a run exists in said input stream by
        detecting when a predetermined number of said adjacent data characters are the same with respect to each other, said detected run including contiguous numerically increasing segments, a segment having one data character less than the next following adjacent segment of said detected run, determining a number representative of the number of data characters in said detected run, generating a sequence of numerically increasing consecutive codes, mathematically determining, by a mathematical algorithm using said representative number, consecutive codes of said sequence to correspond, respectively, to said contiguous segments of said detected run, determining when a run is not occurring in said input stream by determining when said predetermined number of said adjacent data characters are not the same with respect to each other, said predetermined number of adjacent data characters including a first data character, outputting the data character of said detected run and said consecutive codes corresponding to said contiguous segments and outputting each said first data character when a run is not occurring, so as to provide said output stream of codes, and incrementing said sequence to a next following code thereof for each said first data character that is output.

2. The method of claim 1 wherein said detected run includes further data characters following said contiguous segments, said further data characters forming a run including further contiguous numerically increasing segments, said method further including determining the number of said further data characters, outputting the data character of said detected run, incrementing said sequence to a next following code thereof, recursively utilizing said mathematical algorithm using said number of further data characters to mathematically determine further consecutive codes of said sequence corresponding, respectively, to said further contiguous segments, and outputting said further consecutive codes.

3. The method of claim 2 wherein said detected run includes a number of residual data characters following said further contiguous segments, said number of residual data characters being less than said predetermined number, said method further including incrementing said sequence to a next following code thereof and outputting the data character of said detected run for each said residual data character.

4. The method of claim 3 further including discarding the data characters of said detected run, incrementing said sequence to a next following code thereof, and continuing said method with a next data character of said input stream following said discarded data characters.

5. The method of claim 1 wherein said detected run includes a number of residual data characters following said contiguous segments, said number of residual data characters being less than said predetermined number, said method further including incrementing said sequence to a next following code thereof and outputting the data character of said detected run for each said residual data character.

6. The method of claim 5 further including discarding the data characters of said detected run, incrementing said sequence to a next following code thereof, and continuing said method with a next data character of said input stream following said discarded data characters.

7. The method of claim 1 wherein said steps of mathematically determining and outputting comprise initializing an index denoting the number of data characters in a segment, outputting the extant code of said sequence and incrementing said sequence to a next following code thereof, diminishing said representative number by subtracting said index therefrom, incrementing said index by one, comparing said diminished representative number to said incremented index, and repeating the above given steps from outputting said extant code through comparing said diminished representative number to said incremented index until said diminished representative number is less than said incremented index.

8. The method of claim 7 further including the following steps when said diminished representative number is less than said incremented index but not less than said predetermined number incrementing said sequence to a next following code thereof, outputting said data character of said detected run, re-initializing said index, and repeating said steps of outputting said extant code through comparing said diminished representative number to said incremented index until said diminished representative number is less than said incremented index.

9. The method of claim 8 further including the step of diminishing said diminished representative number by one.

10. The method of claim 9 further including the following step when said diminished representative number is less than said incremented index and less than said predetermined number but greater than zero, where said diminished representative number is representative of residual data characters of said detected run incrementing said sequence to a next following code thereof and outputting the data character of said detected run for each said residual data character.

11. The method of claim 1 wherein said steps of mathematically determining and outputting comprise performing a first computation, utilizing a first equation, computing the number of said contiguous numerically increasing segments included in said detected run in terms of said representative number, performing a second computation computing a limit using a second equation that includes adding said number of said contiguous segments to the extant code of said sequence, and outputting said extant code of said sequence and incrementing said sequence to a next following code thereof until said next following code is equal to said limit.

12. The method of claim 11 further including performing a third computation, using a third equation, computing a discard number in terms of the number computed in said first computation.

13. The method of claim 12 further including the following steps when said next following code is equal to said limit diminishing said representative number by said discard number and performing the following steps when said diminished representative number is not less than said predetermined number, outputting the data character of said detected run, incrementing said sequence to a next following code thereof, using said diminished representative number in said first equation to re-compute said first computation, re-computing said limit using said second equation applied to the result of said re-computed first computation, and outputting the extant code of said sequence and incrementing said sequence to a next following code thereof until said next following code is equal to said re-computed limit.

14. The method of claim 13 further including the following step when said diminished representative number is less than said predetermined number but greater than zero, where said diminished representative number is representative of residual data characters of said detected run incrementing said sequence to a next following code thereof and outputting the data character of said detected run for each said residual data character.

15. The method of claim 12 wherein said first equation comprises $$n = \text{Integer Part of } [((8T+1)^{1/2}-1)/2]$$

where n is said number of contiguous segments included in said detected run and T is said representative number, said second equation comprises $$L = [(code+n)-1]$$

where L is said limit and code is said extant code of said sequence, and said third equation comprises $$D = [(n(n+1))/2]$$

where D is said discard number.

16. The method of claim 1 further including discarding the data characters of said segments of said detected run for which corresponding codes are outputted, incrementing said sequence to a next following code thereof, and continuing said method with a next data character of said input stream following said discarded data characters.

17. The method of claim 1 further including storing run segment data comprising the number of data characters in said segments together with the respective codes corresponding thereto, accessing said stored run segment data to determine if a currently detected run includes the number of data characters of a stored segment, and outputting the stored code corresponding to said stored segment.

18. The method of claim 17 further including incrementing said sequence to a next following code thereof after outputting said stored code when the number of data characters of said currently detected run is less than or equal to the maximum number of data characters of a stored segment.

19. The method of claim 17 wherein said step of outputting the stored code further includes outputting the stored code corresponding to said stored segment having the maximum number of data characters when the number of data characters of said currently detected run is greater than said maximum number of data characters of said stored segment.

20. The method of claim 19 further including diminishing said number of data characters of said currently detected run by said maximum number of data characters of said stored segment, and mathematically determining, by said mathematical algorithm using said diminished number of data characters, further consecutive codes of said sequence to correspond, respectively, to contiguous segments of said currently detected run following said maximum number of data characters, outputting said further consecutive codes, and storing run segment data corresponding to said contiguous segments following said maximum number of data characters.

21. The method of claim 17 wherein said predetermined number of adjacent data characters comprises two data characters.

22. The method of claim 17 wherein said predetermined number of adjacent data characters comprises three data characters.

23. The method of claim 1 wherein said predetermined number of adjacent data characters comprises three data characters.

24. Data compression apparatus for compressing an input stream of data characters into an output stream of codes, said input stream including adjacent data characters which, if the same with respect to each other, form a run of the same data character, said apparatus comprising means for detecting when a run exists in said input stream by detecting when a predetermined number of said adjacent data characters are the same with respect to each other, said detected run including contiguous numerically increasing segments, a segment having one data character less than the next following adjacent segment of said detected run, means for determining a number representative of the number of data characters in said detected run, means for generating a sequence of numerically increasing consecutive codes, means for mathematically determining, by a mathematical algorithm using said representative number, consecutive codes of said sequence to correspond, respectively, to said contiguous segments of said detected run, means for determining when a run is not occurring in said input stream by determining when said predetermined number of said adjacent data characters are not the same with respect to each other, said predetermined number of adjacent data characters including a first data character, means for outputting the data character of said detected run and said consecutive codes corresponding to said contiguous segments and outputting each said first data character when a run is not occurring, so as to provide said output stream of codes, and means for incrementing said sequence to a next following code thereof for each said first data character that is output.

25. The apparatus of claim 24 wherein said detected run includes further data characters following said contiguous segments, said further data characters forming a run including further contiguous numerically increasing segments, said apparatus further including means for determining the number of said further data characters, means for outputting the data character of said detected run, means for incrementing said sequence to a next following code thereof, means for recursively utilizing said mathematical algorithm using said number of further data characters to mathematically determine further consecutive codes of said sequence corresponding, respectively, to said further contiguous segments, and means for outputting said further consecutive codes.

26. The apparatus of claim 25 wherein said detected run includes a number of residual data characters following said further contiguous segments, said number of residual data characters being less than said predetermined number, said apparatus further including means for incrementing said sequence to a next following code thereof and outputting the data character of said detected run for each said residual data character.

27. The apparatus of claim 26 further including means for discarding the data characters of said detected run, means for incrementing said sequence to a next following code thereof, and means for fetching a next data character of said input stream following said discarded data characters to continue said compressing of said input stream.

28. The apparatus of claim 24 wherein said detected run includes a number of residual data characters following said contiguous segments, said number of residual data characters being less than said predetermined number, said apparatus further including means for incrementing said sequence to a next following code thereof and outputting the data character of said detected run for each said residual data character.

29. The apparatus of claim 28 further including means for discarding the data characters of said detected run, means for incrementing said sequence to a next following code thereof, and means for fetching a next data character of said input stream following said discarded data characters to continue said compressing of said input stream.

30. The apparatus of claim 24 wherein said means for mathematically determining and said means for outputting comprise iterative means for performing the operations of initializing an index denoting the number of data characters in a segment, outputting the extant code of said sequence and incrementing said sequence to a next following code thereof, diminishing said representative number by subtracting said index therefrom, incrementing said index by one, comparing said diminished representative number to said incremented index, and repeating said operations from outputting said extant code through comparing said diminished representative number to said incremented index until said diminished representative number is less than said incremented index.

31. The apparatus of claim 30 further including recursive means for performing the following operations when said diminished representative number is less than said incremented index but not less than said predetermined number incrementing said sequence to a next following code thereof, outputting said data character of said detected run, re-initializing said index, and repeating said operations of said iterative means from outputting said extant code through comparing said diminished representative number to said incremented index until said diminished representative number is less than said incremented index.

32. The apparatus of claim 31 wherein said recursive means further includes means for diminishing said diminished representative number by one.

33. The apparatus of claim 32 further including residual character processing means for performing the following operation when said diminished representative number is less than said incremented index and less than said predetermined number but greater than zero, where said diminished representative number is representative of residual data characters of said detected run incrementing said sequence to a next following code thereof and outputting the data character of said detected run for each said residual data character.

34. The apparatus of claim 30 wherein said means for generating a sequence of numerically increasing consecutive codes comprises a code counter, and said means for incrementing said sequence to a next following code thereof comprises means for adding one to said code counter, said extant code of said sequence being provided by said code counter.

35. The apparatus of claim 24 wherein said means for mathematically determining and said means for outputting comprise mathematical equation means for performing the operations of a first computation, utilizing a first equation, computing the number of said contiguous numerically increasing segments included in said detected run in terms of said representative number, a second computation computing a limit using a second equation that includes adding said number of said contiguous segments to the extant code of said sequence, and outputting said extant code of said sequence and incrementing said sequence to a next following code thereof until said next following code is equal to said limit.

36. The apparatus of claim 35 wherein said mathematical equation means is further operative for performing the operation of a third computation, using a third equation, computing a discard number in terms of the number computed in said first computation.

37. The apparatus of claim 36 further including recursive means for performing the following operations when said next following code is equal to said limit diminishing said representative number by said discard number and performing the following operations when said diminished representative number is not less than said predetermined number, outputting the data character of said detected run, incrementing said sequence to a next following code thereof, using said diminished representative number in said first equation to re-compute said first computation, re-computing said limit using said second equation applied to the result of said re-computed first computation, and outputting the extant code of said sequence and incrementing said sequence to a next following code thereof until said next following code is equal to said re-computed limit.

38. The apparatus of claim 37 further including residual character processing means for performing the following operation when said diminished representative number is less than said predetermined number but greater than zero, where said diminished representative number is representative of residual data characters of said detected run incrementing said sequence to a next following code thereof and outputting the data character of said detected run for each said residual data character.

39. The apparatus of claim 36 wherein said first equation comprises $$n = \text{Integer Part of } [((8T+1)^{1/2}-1)/2]$$

where n is said number of contiguous segments included in said detected run and T is said representative number, said second equation comprises $$L=[(\text{code}+n)-1]$$

where L is said limit and code is said extant code of said sequence, and said third equation comprises $$D=[(i\ n(n+1))/2]$$

where D is said discard number.

40. The apparatus of claim 24 further including means for discarding the data characters of said segments of said detected run for which corresponding codes are outputted, means for incrementing said sequence to a next following code thereof, and means for fetching a next data character of said input stream following said discarded data characters to continue said compressing of said input stream.

41. The apparatus of claim 24 further including means for storing run segment data comprising the number of data characters in said segments together with the respective codes corresponding thereto, means for accessing said stored run segment data to determine if a currently detected run includes the number of data characters of a stored segment, and means for outputting the stored code corresponding to said stored segment.

42. The apparatus of claim 41 further including means for incrementing said sequence to a next following code thereof after outputting said stored code when the number of data characters of said currently detected run is less than or equal to the maximum number of data characters of a stored segment.

43. The apparatus of claim 41 wherein said means for outputting the stored code comprises means for outputting the stored code corresponding to said stored segment having the maximum number of data characters when the number of data characters of said currently detected run is greater than said maximum number of data characters of said stored segment.

44. The apparatus of claim 43 further including means for diminishing said number of data characters of said currently detected run by said maximum number of data characters of said stored segment, and means for mathematically determining, by said mathematical algorithm using said diminished number of data characters, further consecutive codes of said sequence to correspond, respectively, to contiguous segments of said currently detected run following said maximum number of data characters, means for outputting said further consecutive codes, and means for storing run segment data corresponding to said contiguous segments following said maximum number of data characters.

45. The apparatus of claim 41 wherein said predetermined number of adjacent data characters comprises two data characters.

46. The apparatus of claim 41 wherein said predetermined number of adjacent data characters comprises three data characters.

47. The apparatus of claim 24 wherein said predetermined number of adjacent data characters comprises three data characters.

48. The apparatus of claim 24 wherein said means for generating a sequence of numerically increasing consecutive codes comprises a code counter, and said means for incrementing said sequence to a next following code thereof comprises means for adding one to said code counter.

* * * * *